US012588283B2

(12) United States Patent
Chu et al.

(10) Patent No.: US 12,588,283 B2
(45) Date of Patent: Mar. 24, 2026

(54) SEMICONDUCTOR STRUCTURE AND RELATED METHODS

(71) Applicant: Taiwan Semiconductor Manufacturing Company, Ltd., Hsinchu (TW)

(72) Inventors: Feng-Ching Chu, Pingtung County (TW); I-Hsieh Wong, Hsinchu (TW); Wei-Yang Lee, Taipei City (TW); Chia-Pin Lin, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 677 days.

(21) Appl. No.: 17/446,269

(22) Filed: Aug. 27, 2021

(65) Prior Publication Data

US 2023/0063984 A1 Mar. 2, 2023

(51) Int. Cl.
| | |
|---|---|
| *H10D 86/00* | (2025.01) |
| *H01L 21/02* | (2006.01) |
| *H10D 30/01* | (2025.01) |
| *H10D 30/67* | (2025.01) |
| *H10D 86/01* | (2025.01) |

(52) U.S. Cl.
CPC ..... *H10D 86/215* (2025.01); *H01L 21/02233* (2013.01); *H01L 21/02271* (2013.01); *H10D 30/031* (2025.01); *H10D 30/6735* (2025.01); *H10D 30/6757* (2025.01); *H10D 86/011* (2025.01)

(58) Field of Classification Search
CPC ........... H01L 27/1211; H01L 21/02233; H01L 21/02271; H01L 29/42392; H01L 29/66742; H01L 29/78696; H01L 21/845
See application file for complete search history.

(56) References Cited

U.S. PATENT DOCUMENTS

| | | | |
|---|---|---|---|
| 5,834,812 | A | 11/1998 | Golland et al. |
| 6,410,371 | B1 | 6/2002 | Yu et al. |
| 6,627,519 | B2 | 9/2003 | Kwon et al. |
| 7,180,138 | B2 | 2/2007 | Park et al. |
| 2017/0194194 | A1 | 7/2017 | Tsai et al. |

(Continued)

OTHER PUBLICATIONS

Kal et. al. "Selective isotropic etching of Group IV semiconductors to enable gate all around device architectures," presentation by TEL and IMEC, 2018, https://www.linx-consulting.com/wp-content/uploads/2018/04/01-06-S_Kal-TEL-imec_Selective_isotropic_etching_of_Group-IV_semiconductors.pdf (Year: 2018).*

(Continued)

*Primary Examiner* — Steven B Gauthier
*Assistant Examiner* — Alvin L Lee
(74) *Attorney, Agent, or Firm* — Haynes and Boone, LLP

(57) ABSTRACT

Methods and associated devices including the fabrication of a semiconductor structure that provides a silicon-on-insulator substrate. The semiconductor structure may be formed by providing a base substrate, forming a sacrificial layer over the base structure, and forming a semiconductor layer over the sacrificial layer. The sacrificial layer is removed to form a void that is filled with oxide. The semiconductor structure includes a dielectric support feature extending through the semiconductor and oxide layers and/or a portion of the oxide layer extends to the surface of the semiconductor layer.

20 Claims, 19 Drawing Sheets

(56) References Cited

U.S. PATENT DOCUMENTS

2019/0393040 A1 * 12/2019 Chen .................. H10D 30/6735
2020/0176420 A1 * 6/2020 Or-Bach ............. H01L 25/0657

OTHER PUBLICATIONS

Gosalvez et. al. "Chapter 24—Wet etching of Silicon," Handbook of Silicon Based MEMS Materials and Technologies, William Andrew Publishing, 2010, pp. 375-407 (Year: 2010).*

L. Jastrzebski, "SOI by CVD: Epitaxial Lateral Overgrowth (ELO) process—Review," Journal of Crystal Growth, vol. 63, Issue 3, 1983 (Year: 1983).*

C.-P. S. Hsu, "Tunable Silicon-Germanium and Silicon Selective Etch in 5-Nanometer and Below Applications," 2019 China Semiconductor Technology International Conference (CSTIC), Shanghai, China, 2019, pp. 1-2, doi: 10.1109/CSTIC.2019.8755675. (Year: 2019).*

* cited by examiner

Figure 1:
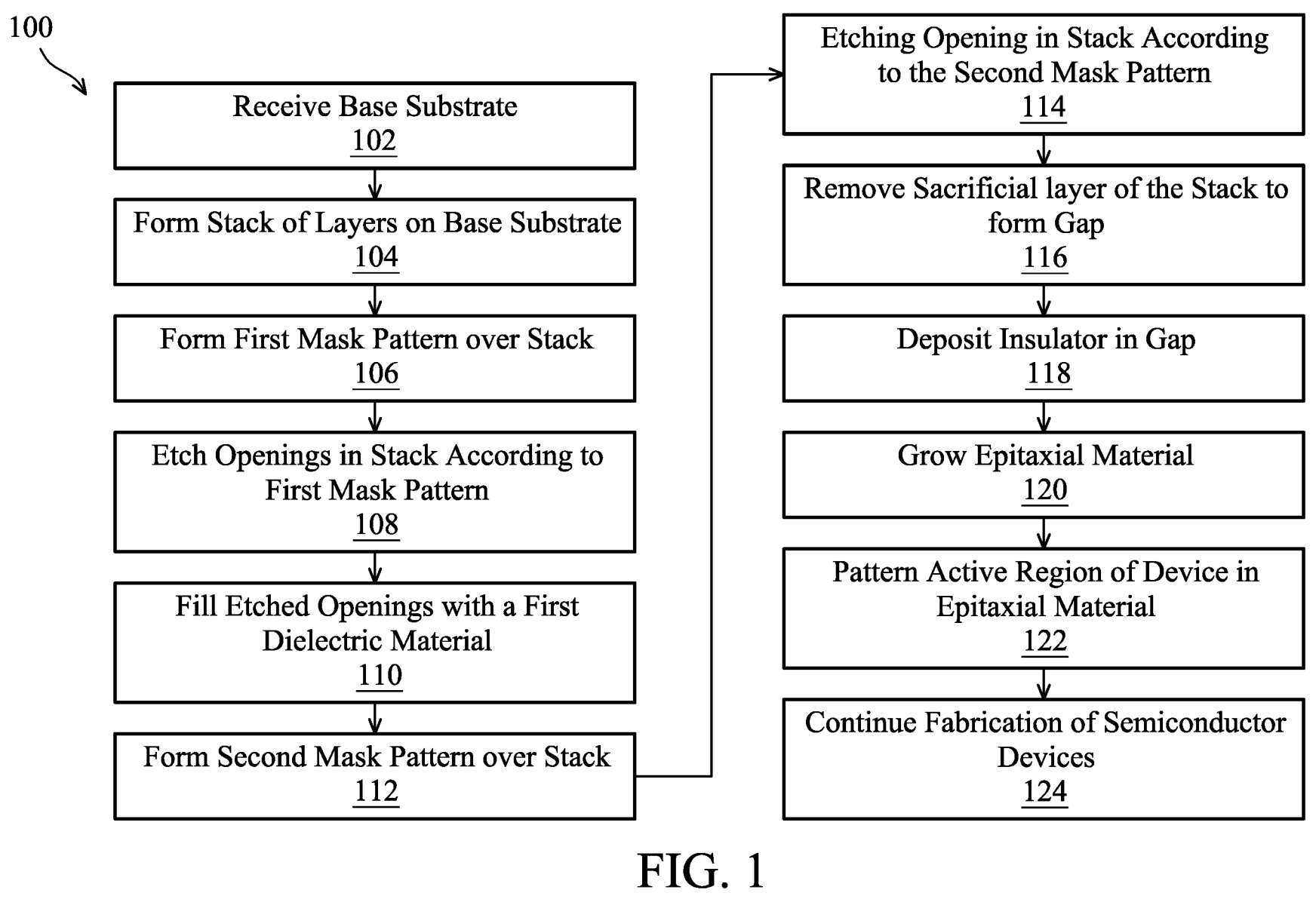

100

Receive Base Substrate
102

Form Stack of Layers on Base Substrate
104

Form First Mask Pattern over Stack
106

Etch Openings in Stack According to First Mask Pattern
108

Fill Etched Openings with a First Dielectric Material
110

Form Second Mask Pattern over Stack
112

Etching Opening in Stack According to the Second Mask Pattern
114

Remove Sacrificial layer of the Stack to form Gap
116

Deposit Insulator in Gap
118

Grow Epitaxial Material
120

Pattern Active Region of Device in Epitaxial Material
122

Continue Fabrication of Semiconductor Devices
124

200
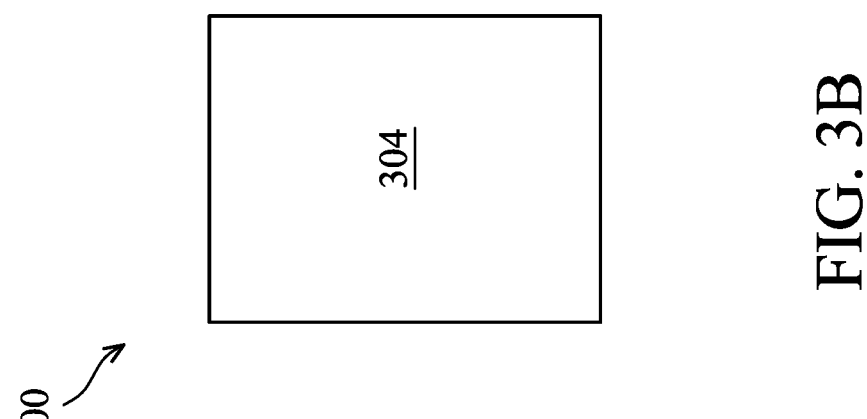
304
FIG. 3B
200
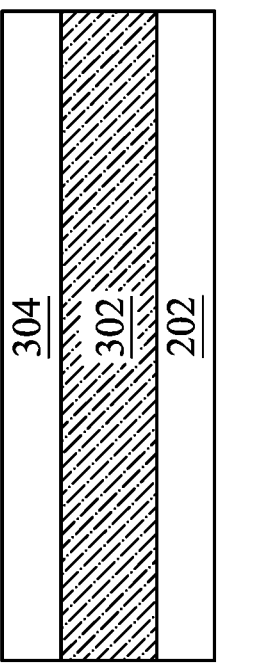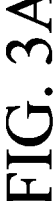
304
302
202
FIG. 3A

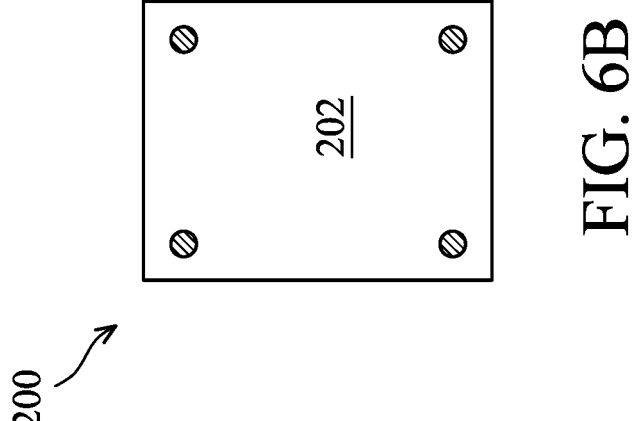
FIG. 6B
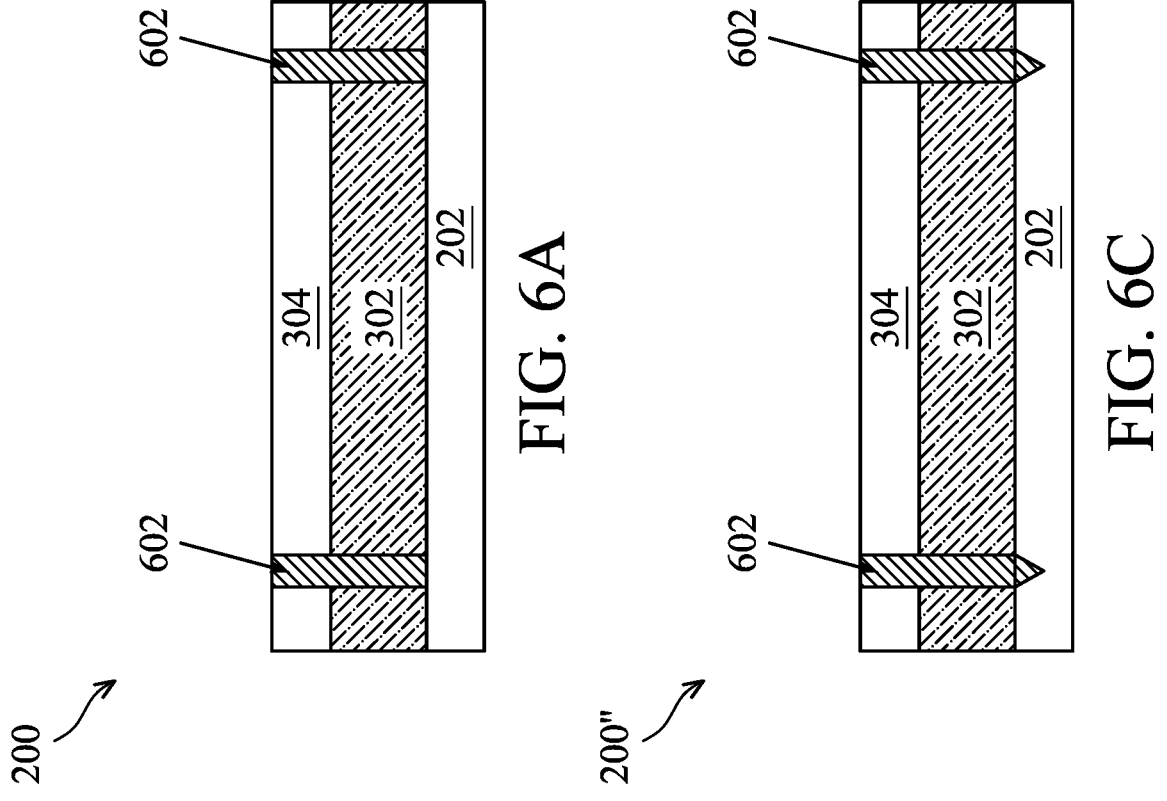
FIG. 6A
FIG. 6C

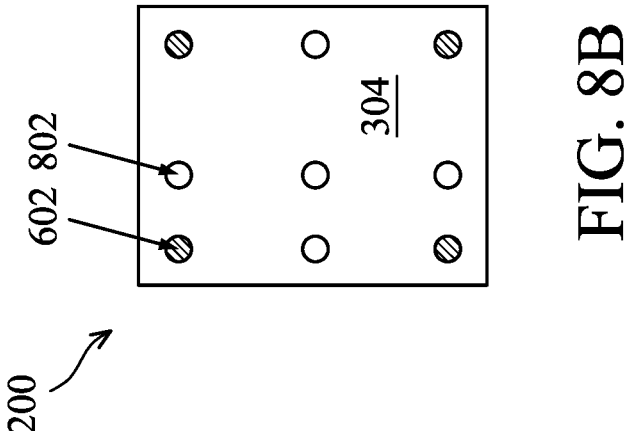
FIG. 8B
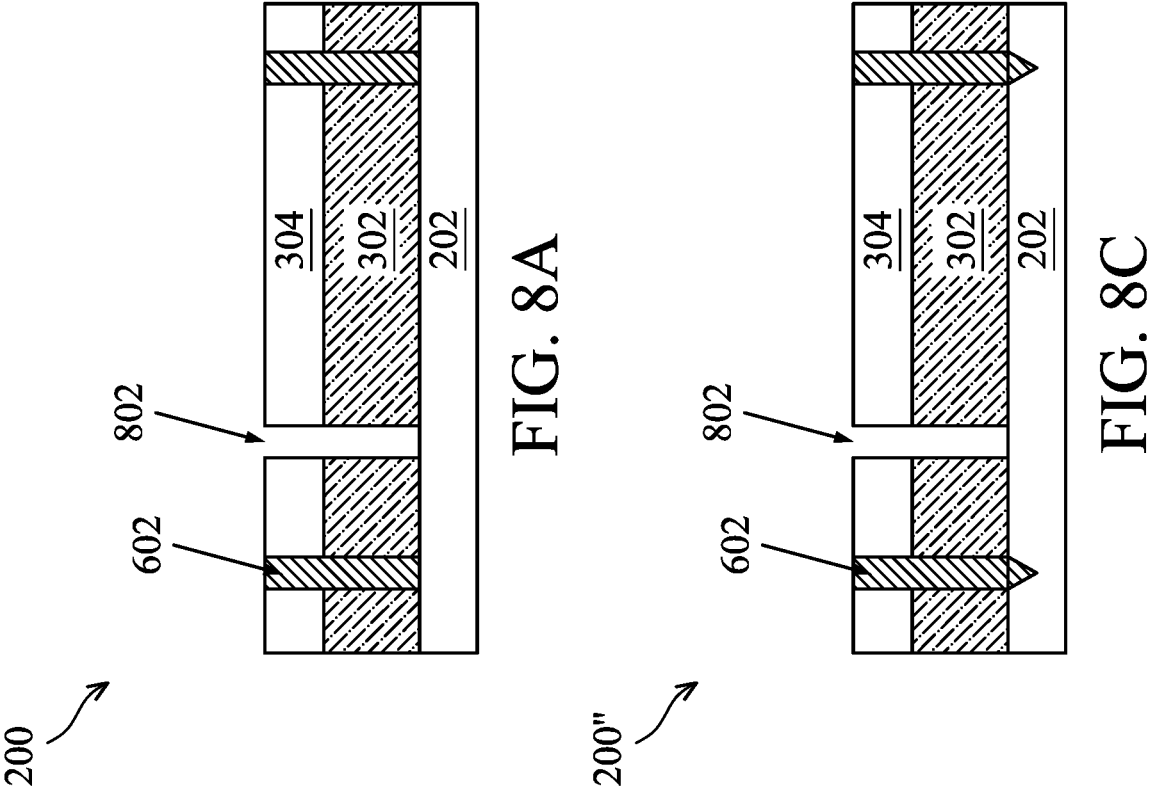
FIG. 8A
FIG. 8C

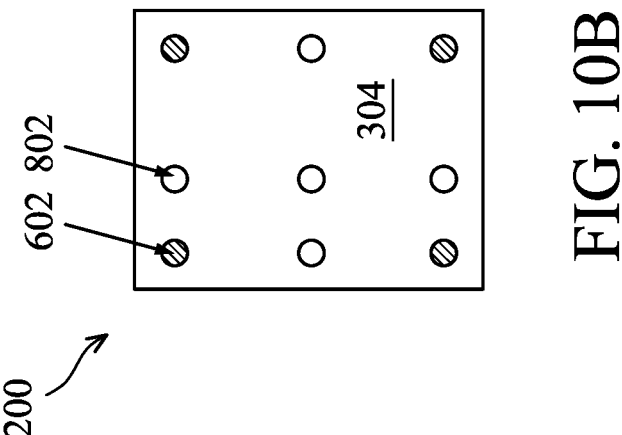
FIG. 10B
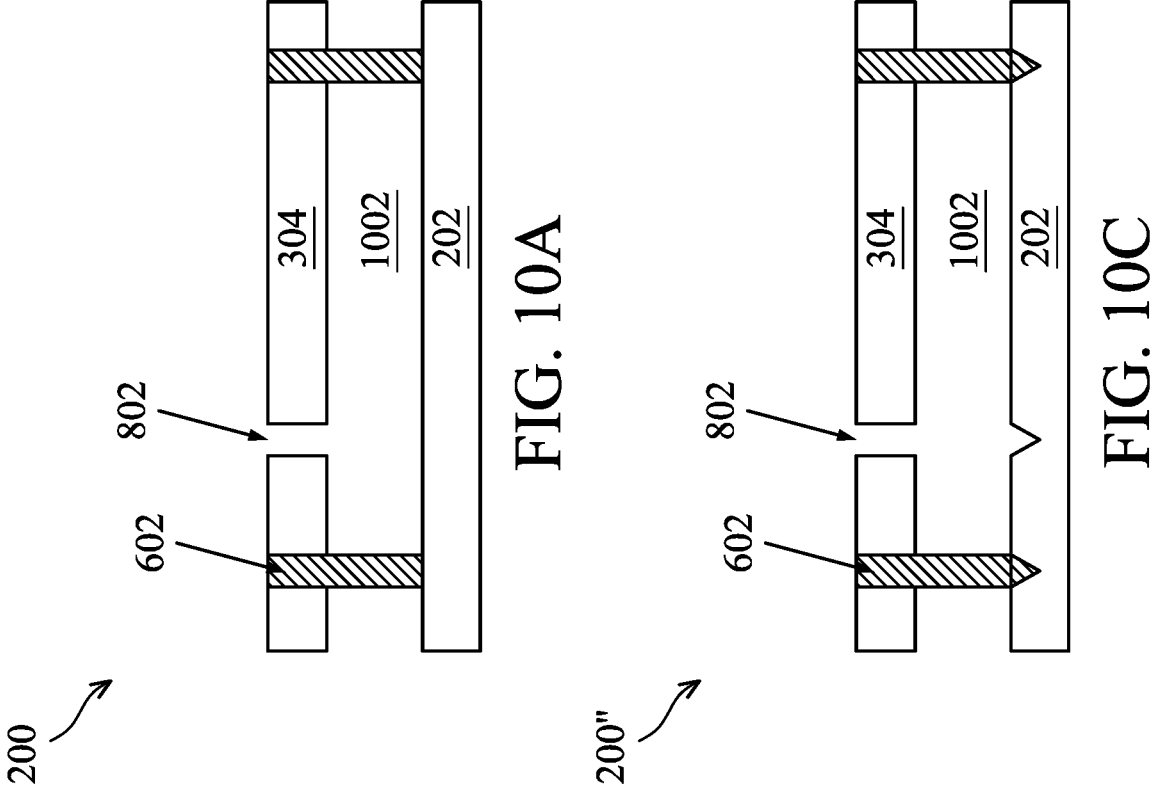
FIG. 10A
FIG. 10C

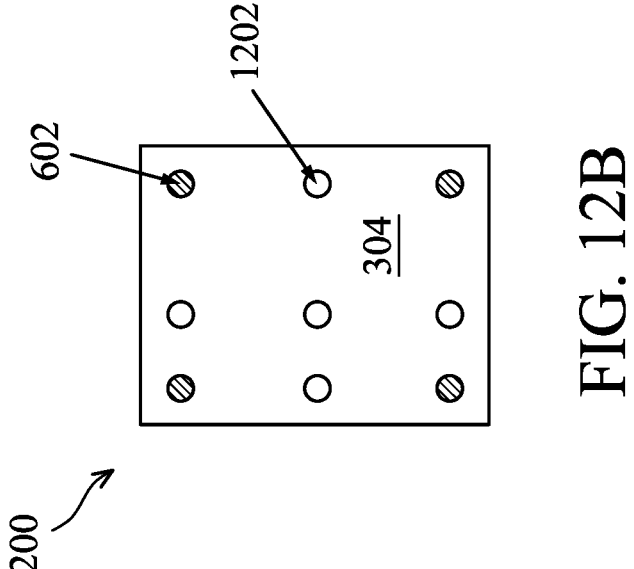
FIG. 12B
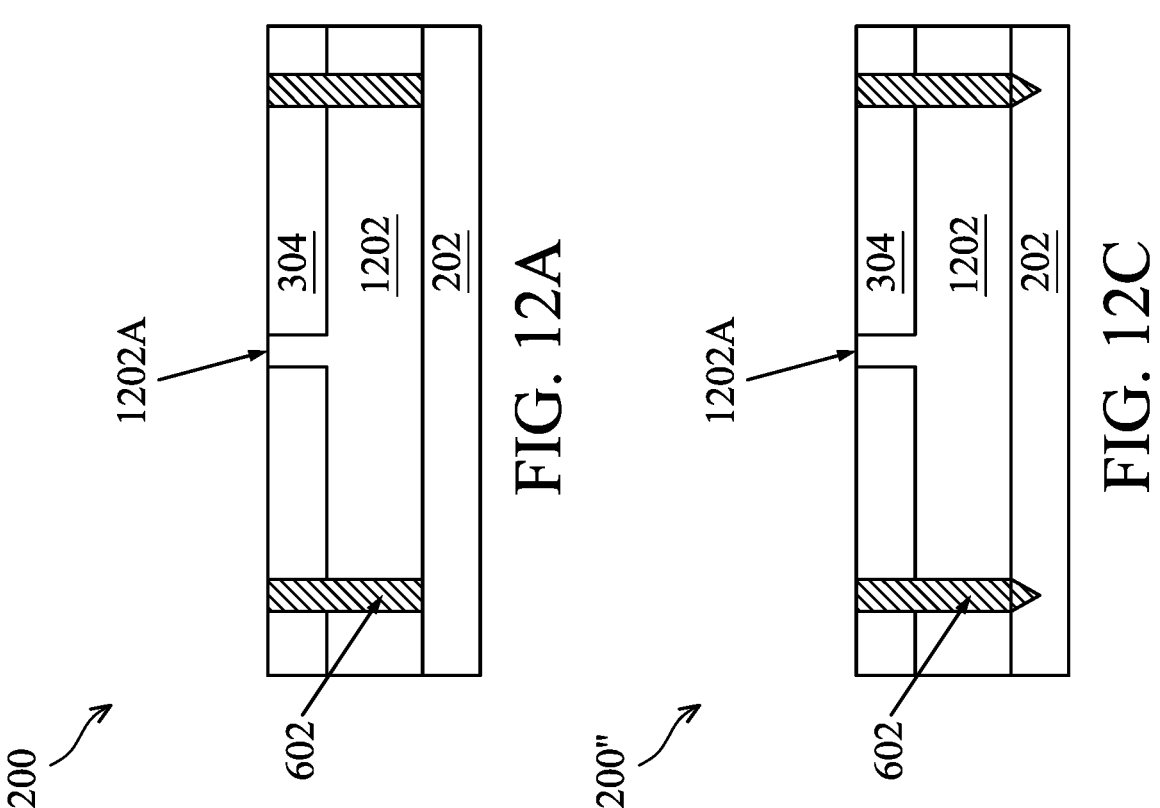
FIG. 12A
FIG. 12C

200

1404

1402

200

1404 1404

1402

304

1202

202

602

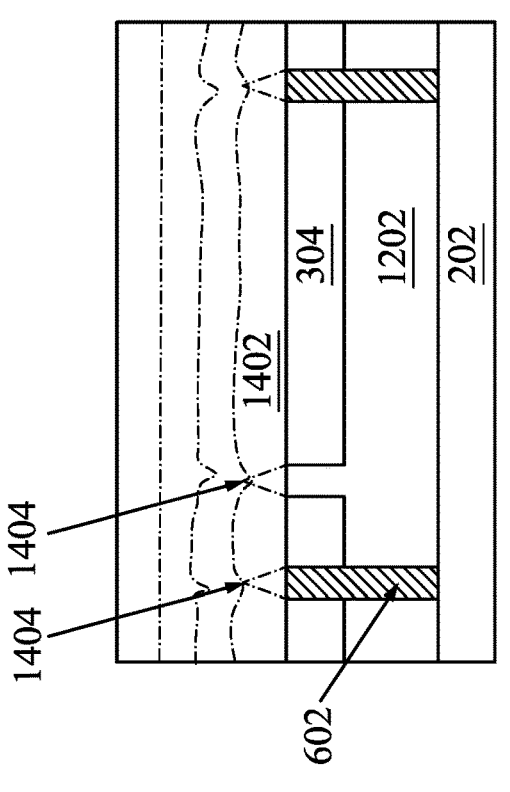
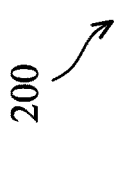
FIG. 14D
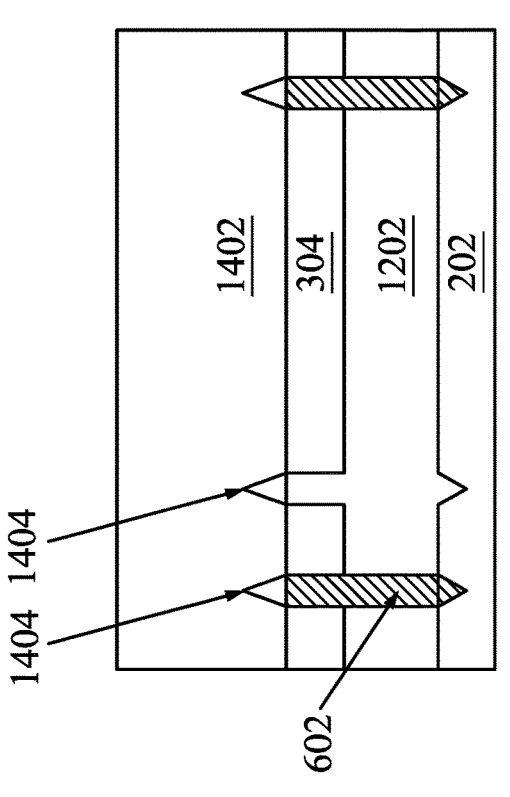
FIG. 14C

200'

1404

1402

200'

1402

304

1202

202

1404

1404

602

SEMICONDUCTOR STRUCTURE AND RELATED METHODS

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs).

One technique to achieve the miniaturization of semiconductor devices is optimization of the substrate on which the semiconductor devices are formed. As the technologies nodes decrease, many ICs are formed on substrates that are silicon-on-insulator (SOI) structures. SOI structures can provide a thick inactive base layer that provides mechanical stability, an electrically insulating intermediate layer, and a thin top layer such as single-crystalline silicon. While SOI substrates and the methods of fabricating thereof have been suitable in some respects, previous processes may experience quality, reliability and complex manufacturing leading to higher costs. As devices continue to shrink, the defect rate required of the substrates, including the SOI structures, must similarly shrink. Thus, what is desired is improved substrate structures for semiconductor devices and manufacturing methods thereof.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a flow chart of a method of fabricating a semiconductor structure, in some implementations including forming a semiconductor device on said semiconductor structure, according to one or more aspects of the present disclosure;

FIGS. 2A, 3B, 4B, 5B, 6B, 7B, 8B, 9B, 10B, 11B, 12B, 13B, 14B, 15B, 16B, and 16C are top views of embodiments of semiconductor structures according to aspects of the method of FIG. 1;

FIGS. 2B, 3A, 4A, 4C, 5A, 6A, 6C, 7A, 8A, 8C, 9A, 10A, 10C, 11A, 12A, 12C, 13A, 14A, 14C, 14D, 15A, 16A, and 16D are cross-sectional views of embodiments of semiconductor structures corresponding to the top views of FIGS. 2A, 3B, 4B, 5B, 6B, 7B, 8B, 9B, 10B, 11B, 12B, 13B, 14B, 15B, 16B and 16C;

DETAILED DESCRIPTION

Figures 2A, 2B:
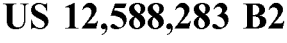

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The present disclosure presents a semiconductor structure on which various semiconductor devices can be formed. Some semiconductor devices of some of the illustrated embodiments are formed as multi-gate transistors. Multi-gate transistors include those transistors whose gate structures are formed on at least two-sides of a channel region. These multi-gate devices may include a P-type metal-oxide-semiconductor device or an N-type metal-oxide-semiconductor multi-gate device. Specific examples may be presented and referred to herein as FINFET, on account of their fin-like structure or a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanostructures such as nanowire channel(s), bar-shaped channel(s), and/or other suitable channel configuration. One of ordinary skill may recognize many other examples of semiconductor devices that may benefit from aspects of the present disclosure. Various other types of semiconductor devices may be formed on the semiconductor substrate such as, additional transistors (e.g., planar or other type), bipolar junction transistors, resistors, capacitors, inductors, diodes, fuses, static random-access memory (SRAM) and/or other logic circuits, etc. In some embodiments, on the semiconductor structure formed as discussed below, a plurality of semiconductor devices (e.g., transistors), including PFETs, NFETs, etc., are formed which may be interconnected to form an integrated circuit (IC).

Embodiments of the present disclosure offer advantages over the existing art, though it is understood that other embodiments may offer different advantages, not all advantages are necessarily discussed herein, and no particular advantage is required for all embodiments. In accordance with embodiments of the present disclosure, a process flow and structure are provided that forms a semiconductor structure on which semiconductor devices, such as those discussed above, are formed that includes a simplified CMOS compatible process flow for its fabrication, an improved insulator quality, and/or an increased semiconductor material quality for formation of semiconductor devices.

In contrast, in other implementations, such as bonding and etching back (BE) silicon-on insulator (BESOI) process to form SOI wafers include complex processing steps that require a device wafer and a handle wafer on which various layers are formed. The complexity of the flows and/or the issue of additional handle wafers may be undesirable and there may be challenges in forming quality material layers and a quality bonding between wafers. One or more of these challenges may be addressed by certain aspects of the present disclosure. For example, in some implementations, only a starting wafer is needed. Thus, in some implementations, bonding of wafers is avoided. Further, in some implementations of the methods discussed herein, a high-quality insulator (e.g., oxide) can be formed though insulator deposition process(es). In an embodiment, forming a thermally-grown oxide can be avoided, though thermally grown oxide may also be used in some implementations. Further, the structures and the methods discussed herein allow for, in some embodiments, semiconductor material to be grown on another semiconductor material rather than formed on an oxide layer. Thus, in some embodiments, the quality or performance (e.g., strain) of the grown layer can be more suitable for the desired semiconductor device quality, for example, by making use of an epitaxial seed area of another semiconductor material rather than an insulator.

Illustrated in FIG. 1 is a method 100 of fabrication of a semiconductor structure. In some implementations, the semiconductor structure fabricated using one or more steps of the method 100 provides a semiconductor structure of a silicon-on-insulator (SOI) structure, also referred to as an SOI substrate. SOI structures may provide advantages over forming devices on a bulk silicon substrate for some devices. For example, benefits of SOI structures can include, but are not limited to, lower parasitic capacitance due to isolation of the device(s) from the bulk silicon, improved power consumption, greater resistance to latch-up due to isolation, lower leakage currents due to isolation, higher power efficiency, and/or other possible benefits.

It is understood that the method 100 includes steps having features of a complementary metal-oxide-semiconductor (CMOS) technology process flow and thus, are only described briefly herein. Additional steps may be performed before, after, and/or during the method 100. The method 100 may include in some embodiments, a plurality of semiconductor devices as discussed above, including multi-gate devices, which are formed on the semiconductor structure. In other embodiments of the method 100, the semiconductor structure may be provided to other methods of fabrication including by other entities.

FIGS. 2B, 3A, 4A, 6A, 8A, 10A, 12A, 14A, 14D and 16A are fragmentary cross-sectional views of an embodiment of a semiconductor structure 200 according to various stages of the method 100 of FIG. 1. FIGS. 2A, 3B, 4B, 6B, 8B, 10B, 12B, 14B, 16B and 16C are fragmentary top views, corresponding to respective cross-sectional views listed above, of an embodiment of the semiconductor structure 200. FIGS. 5A, 7A, 9A, 11A, 13A, and 15A are fragmentary cross-sectional views of an embodiment of a semiconductor structure 200' according to various stages of the method 100 of FIG. 1. FIGS. 5B, 7B, 9B, 11B, 13B, and 15B are fragmentary top views, corresponding to respective cross-sectional views listed above, of an embodiment of the semiconductor structure 200'. The example of semiconductor structure 200' is substantially similar to the semiconductor structure 200, except for certain differences noted here. Similarly, FIGS. 4C, 6C, 8C, 10C, 12C, 14C, and 16D are fragmentary cross-sectional views of an embodiment of a semiconductor structure 200" according to various stages of the method 100 of FIG. 1. The example of semiconductor structure 200" is substantially similar to the semiconductor structure 200 (including the top views), except for certain differences noted here. Descriptions of the structure 200 generally apply to the variations of semiconductor structure 200' and 200". It is understood that parts of the semiconductor structure 200 may be fabricated by a CMOS technology process flow, and thus some processes are only briefly described herein.

The method 100 begins at block 102 where a base substrate is received. In some embodiments, the base substrate is a bulk substrate, or bulk silicon substrate. Referring to the example of FIGS. 2A and 2B, in an embodiment of block 102, a base substrate 202 is received. In some embodiments, the base substrate 202 may be a semiconductor substrate such as a silicon substrate. The base substrate 202 may be in the form of a wafer. In some implementations, the base substrate 202 is a substantially circular wafer except for alignment features such as a notch or flat edge. Exemplary dimensions of the base substrate 202 include, but are not limited to, a diameter of 100 mm to 450 mm. In an embodiment, the base substrate 202 is a wafer having a diameter of 300 mm. The base substrate 202 may be fabricated in known semiconductor processes such as the formation of a silicon ingot by various methods such as being grown by the Czochralski (CZ) method, which is then sliced to form the base substrate 202. In some embodiments, the base substrate 202 is provided for mechanical structure and active devices or features thereof are not formed within the base substrate 202 itself.

FIG. 2A includes a fragmentary top view of a portion of the base substrate 202 illustrated as a rectangular portion of the base substrate 202. This rectangular fragmentary portion is used for illustration of the top view of the structure 200 in the following figures and is illustrative of patterns that may be formed in a repeating manner across the entirety of the substrate 202 in its wafer-form. In other embodiments, the pattern provided varies across the wafer, for example, aspects of the structure 200 and the structure 200' may be formed on a single wafer.

The method 100 then proceeds to block 104 where a stack of layers is formed on the base substrate. In an embodiment, the stack of layers includes a first sacrificial layer and an overlying layer of semiconductor material. In an embodiment, the sacrificial layer is silicon germanium. In an embodiment, the overlying layer of semiconductor material is silicon. However, other embodiments are possible including those that provide for a first composition and a second composition having different etch selectivity. In an embodiment, the sacrificial layer composition is selected based on its etch selectivity with respect to the overlying layer of semiconductor material and its lattice mismatch with the crystalline orientation of the overlying layer of semiconductor material. For example, the material of the sacrificial layer may be selected to provide a lattice mismatch that allows for desirable stress/strain of the overlying semiconductor material with a tolerable defect level. For example, the mismatch between silicon and germanium (e.g., ~4.2%) can form dislocations during the growth of the semiconductor layer, such as misfit dislocations but allows for a stress to be generated in the semiconductor layer in some implementations. The percentage of Ge can be modified to balance these aspects. In an embodiment, the semiconductor material layer of the stack is suitable for forming features of a semiconductor device, such as an active area of semiconductor device. In other implementations, other device layers are formed over the semiconductor layer, including layer(s) that form the active area of a device. For example, in an embodiment, the overlying layer of semiconductor material is used as a seed area for epitaxial growth of a layer forming an active area of a device.

Referring to the example of FIGS. 3A and 3B, a sacrificial layer 302 is disposed on the base substrate 202 and a semiconductor layer 304 is disposed on the sacrificial layer 302. In an embodiment, a thickness of the semiconductor layer 304 may be between approximately 2 nanometers (nm) and 500 nm. In an embodiment, a thickness of the sacrificial layer 302 may be between approximately 100 nanometers (nm) and 500 nm. The thickness of the sacrificial layer 302 may be selected to provide the appropriate thickness of the insulating material layer of the SOI structure to be formed. In an embodiment, the sacrificial layer 302 is SiGe and the semiconductor layer 304 is Si. For example, where sacrificial layer 302 may be SiGe and the semiconductor layer 304 may be Si, a silicon etch rate of semiconductor layer 304 is significantly less than a silicon germanium etch rate of semiconductor layer 304. This allows for the subsequent removal of the sacrificial layer 302 as discussed below with reference to block 116 of the method 100, while maintaining the semiconductor layer 304.

In some embodiments, the difference in etch rate can be provided by a similar material composition, for example, semiconductor layer 304 and sacrificial layer 302 can include silicon germanium, where semiconductor layer 304 has a first silicon atomic percent and/or a first germanium atomic percent and sacrificial layer 302 have a second, different silicon atomic percent and/or a second, different germanium atomic percent. The present disclosure contemplates that semiconductor layer 304 and sacrificial layer 302 include any combination of semiconductor materials that can provide desired etching selectivity, and/or desired characteristics (e.g., materials that provide lattice mismatch that allows for high quality growth of the semiconductor layer 304).

By way of example, formation of the layers of the sacrificial layer 302 and the semiconductor layer 304 may be performed by a molecular beam epitaxy (MBE) process, liquid phase epitaxy, vapor-phase epitaxy, a metalorganic chemical vapor deposition (MOCVD) process, a chemical vapor deposition (CVD) process, ultra-high vacuum CVD (UHV-CVD), LPCVD, and/or PECVD), and/or other suitable formation processes. In an embodiment, the sacrificial layer 302 is a silicon germanium layer grown using a seed of a top surface of the base substrate 202, which can be silicon. In an embodiment, the semiconductor layer 304 is a silicon layer grown using a seed of a top surface of the sacrificial layer 302, which can be silicon germanium. In some embodiments, the quality of the semiconductor layer 304 can be improved due to its growth on crystalline material (e.g., silicon germanium) as opposed to growth on an oxide layer.

The method 100 then proceeds to block 106 where a first mask pattern is formed over the stack. The first mask pattern may be provided by a masking element disposed on the semiconductor structure. In some embodiments, a photolithography (photo) step is performed to form a patterned photoresist (resist) layer that provides a masking element. The masking element may define the pattern of openings for dielectric support features, discussed below.

The lithography process can include forming a resist layer over semiconductor layer 304 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer, referred to as the masking element, includes a resist pattern that corresponds with the mask. The masking element may include other layers such as anti-reflective coatings, hard mask, multi-layer resists, and other materials suitable for implementing the patterning process.

The method 100 then proceeds to block 108 where openings in the stack are etched according to the first mask pattern provided above in block 106. The etching process may be a dry etching process, a wet etching process, or a combination thereof. The dry etching process may implement a hydrogen-comprising etch gas (e.g., H2 and/or CH4), a nitrogen-comprising etch gas (for example, N2 and/or NH3), a chlorine-comprising etch gas (for example, Cl2, CHCl3, CCl4, and/or BCl3), a fluorine-comprising etch gas (for example, F2, CH3F, CH2F2, CHF3, CF4, C2F6, SF6, and/or NF3), a bromine-comprising etch gas (e.g., Br, HBr, CH3Br, CH2Br2, and/or CHBr3), other suitable etch gas, or combinations thereof. In an embodiment, the etchant gas includes one or more of HBr, CH4, CH3F, and/or Cl etchant gases. In some embodiments, the dry etching process can use a carrier gas to deliver the etchant gas. The carrier gas includes nitrogen, argon, helium, xenon, other suitable carrier gas constituent, or combinations thereof. In some embodiments, the etch process includes multiple steps. After the etching process, the masking element (e.g., resist layer) may be removed, for example, by way of a solvent, resist stripper, ashing, or other suitable technique.

Figures 4A, 4B, 4C:
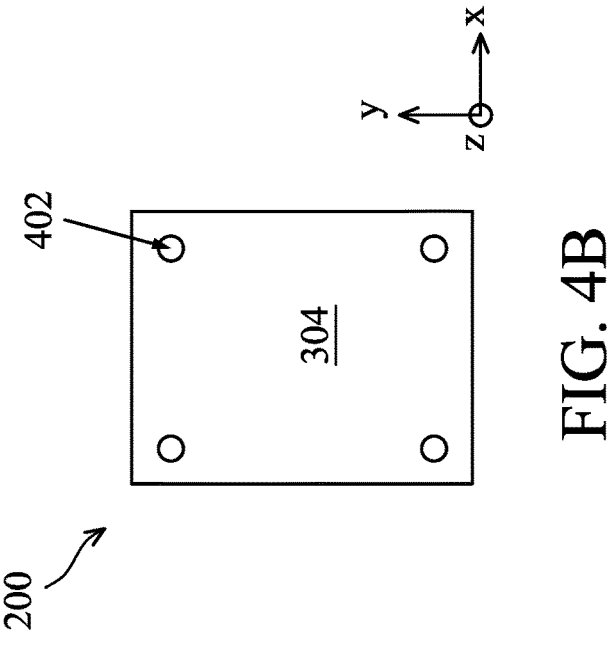

Referring to the example of FIGS. 4A, 4B, and 4C, openings 402 are etched in the stack including through the sacrificial layer 302 and the semiconductor layer 304. The etching may stop at the base substrate 202 as illustrated in FIG. 4A. In other implementations, the etching may etch slightly into the base substrate 202 as illustrated in FIG. 4C. In an embodiment, the base substrate 202 may be etched along facets of the material (e.g., Si), and thus, the opening 402" has a bottom portion within the base substrate 202 that is a triangular shape in the cross-section cut along the z-direction. The top view of FIG. 4B may also apply to the structure 200". In some embodiments, by over-etching into the base substrate 202, the openings 402" are ensured to provide dielectric support features that extend to the base substrate 202 and provide adequate mechanical support, and thus, reducing a risk of under-etching that would leave sacrificial material under openings 402 and a suspended dielectric support feature on removal of the sacrificial material discussed below.

Figure 5B:
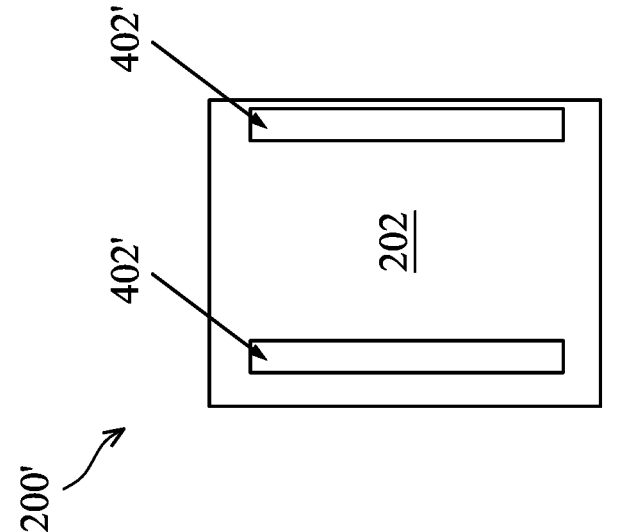
Figure 5A:
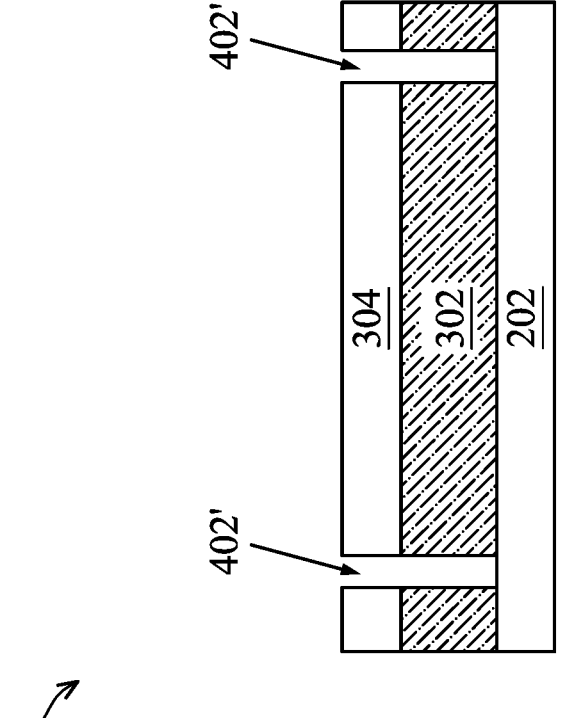
Figure 7B:
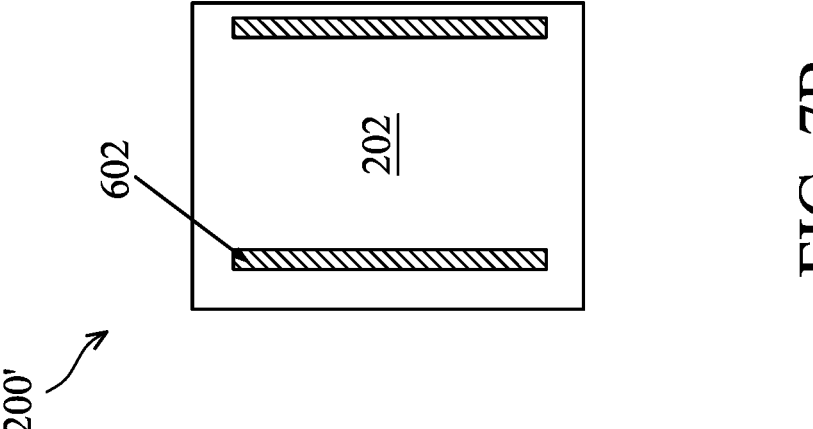
Figure 7A:
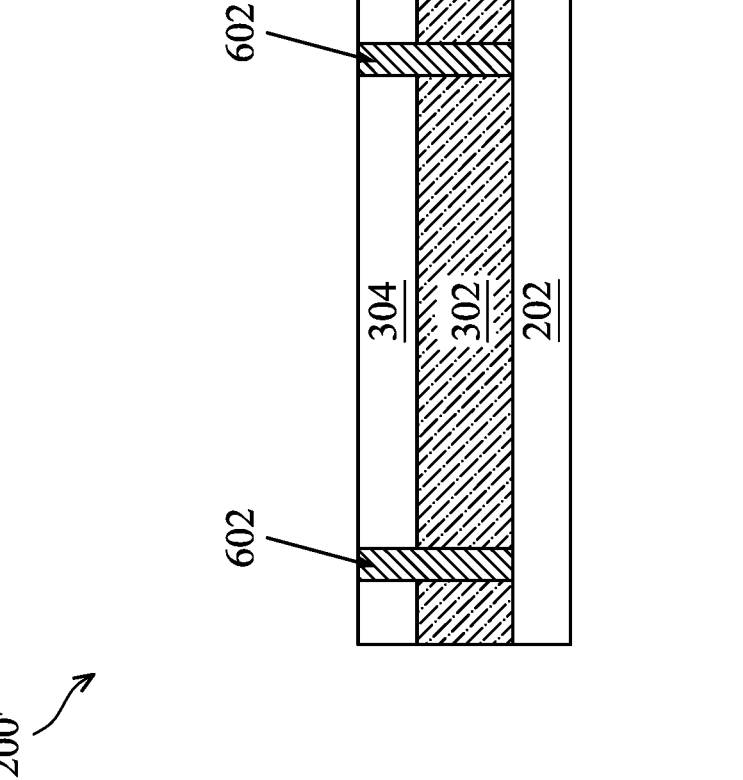

The openings 402 as illustrated in FIG. 4B have a circular-shape in the top-view, in other words, in a cross-section cut along the x-direction and y-direction. However, the shape of openings 402 illustrated in FIG. 4B are exemplary only and other shapes and/or patterns may also be possible. For example, the openings 402 may be circular, rectangular, linear bars, and/or other suitable shapes. As another example, the openings 402' of FIGS. 5A and 5B illustrate a linear bar shaped opening in the cross-section cut along the x-direction and y-direction. While the openings 402' illustrated in FIGS. 5A and 5B provide a bottom of the opening 402' at the top surface of the base substrate 202, in other implementations, the base substrate 202 may be slightly etched as discussed above with reference to FIG. 4C and openings 402".

The pattern of openings 402 and/or 402' (see FIGS. 4B, 5B) are exemplary only and other patterns are possible. In some implementations, the configuration of the openings 402 (402', 402") including their pattern, size, and shape is selected to provide adequate mechanical support for the semiconductor layer 304 when forming the gap 1002 as discussed below. In some implementations, the pattern of the openings 402 is also selected to provide lateral offset between the openings 402 and the regions of the substrate upon which the active areas of semiconductor devices will subsequently be formed. In other words, the openings 402 are not directly underneath (in the z-direction) the region of the wafer upon which the active regions such as channel regions will be formed. Instead, the openings 402 are offset laterally in the x-direction and/or y-direction from an active region disposed over the sacrificial layer 302 in the z-direction. This discussion is equally applicable to openings of other shapes such as openings 402'. As discussed below, the lateral offset is important in some implementations to minimize defects formed over the dielectric support features disposed in the openings 402 from impacting the defect-sensitive active region of the semiconductor device.

The method 100 then proceeds to block 110 where the openings in the stack of layers etched above in block 108 are filled with a first dielectric material. In an embodiment, the first dielectric material is silicon nitride (SiN). Other exemplary materials include silicon oxynitride (SiON), silicon carbon nitride (SiCN), and/or silicon oxycarbon nitride (SiOCN). The first dielectric material may be deposited by CVD, PVD, HDPCVD, MOCVD, RPCVD, PECVD, LPCVD, APCVD, SAVCD, other suitable methods, or combinations thereof. The deposition process may be followed by a planarization process such as a chemical mechanical polish (CMP) may be performed to remove any deposited dielectric material from over the stack of materials (e.g., from a top surface of the semiconductor layer of the stack of layers).

Referring to the example of FIGS. 6A, 6B, 6C, 7A, and 7B, the openings 402 are filled with dielectric material forming dielectric support features 602. In an embodiment, the dielectric support features 602 are SiN. The dielectric support features 602 may also be referred to as "pillars" due to their elongated shape. In some embodiments, as shown in FIG. 6C, the dielectric support features 602 extend into the base substrate 202 due to the over-etching illustrated in FIG. 4C. In some embodiments, as shown in FIG. 6A, the dielectric support features 602 have a bottom coplanar with a top surface of base substrate 202.

The method 100 then proceeds to block 112 where a second mask pattern is formed over the stack. The second mask pattern may be provided by a masking element disposed on the semiconductor layer 304. In some embodiments, a photolithography (photo) step is performed to form a patterned photoresist (resist) layer that provides the masking element. The second masking element may define a pattern of openings that designate a second region of the stack of materials to be removed, that is separated a distance from the regions defined by the first masking element of block 106. The second pattern may define openings to be etched in the semiconductor layer sufficient to allow etchant to enter through the openings and remove the sacrificial layer, as discussed below.

The lithography process can include forming a resist layer over semiconductor layer of the stack of layers (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask.

The method 100 then proceeds to block 114 where openings in the stack are etched according to the second mask pattern provided above in block 112. The etching process may be a dry etching process, a wet etching process, or a combination thereof. The dry etching process may implement a hydrogen-comprising etch gas (e.g., H2 and/or CH4), a nitrogen-comprising etch gas (for example, N2 and/or NH3), a chlorine-comprising etch gas (for example, Cl2, CHCl3, CCl4, and/or BCl3), a fluorine-comprising etch gas (for example, F2, CH3F, CH2F2, CHF3, CF4, C2F6, SF6, and/or NF3), a bromine-comprising etch gas (e.g., Br, HBr, CH3Br, CH2Br2, and/or CHBr3), other suitable etch gas, or combinations thereof. In an embodiment, the etchant gas includes one or more of HBr/CH4/CH3F/Cl. In some embodiments, the dry etching process can use a carrier gas to deliver the etch gas. The carrier gas includes nitrogen, argon, helium, xenon, other suitable carrier gas constituent, or combinations thereof. In some embodiments, the etch process includes multiple steps. After the etching process, the resist layer may be removed, for example, by way of a solvent, resist stripper, ashing, or other suitable technique. In an embodiment, the etching of block 114 is substantially similar to the etching of block 108, but providing a different pattern such that the openings are spaced a distance from those defined in block 108.

Referring to the example of FIGS. 8A, 8B, 8C, 9A, and 9B, openings 802 are etched in stack of layers of sacrificial layer 302 and semiconductor layer 304. In an embodiment, the etching may stop at the base substrate 202 as illustrated. In other embodiments, the etching may continue slightly into the base substrate 202 similar to as illustrated with reference to the openings 402″ of FIG. 4C. In other embodiments, the etching may stop within the sacrificial layer 302 such that the bottom of the opening 802 is defined by the sacrificial layer 302. The openings 802 have dimensions (e.g., width, depth) sufficient to provide etchant to the sacrificial layer 302.

Figure 9B:
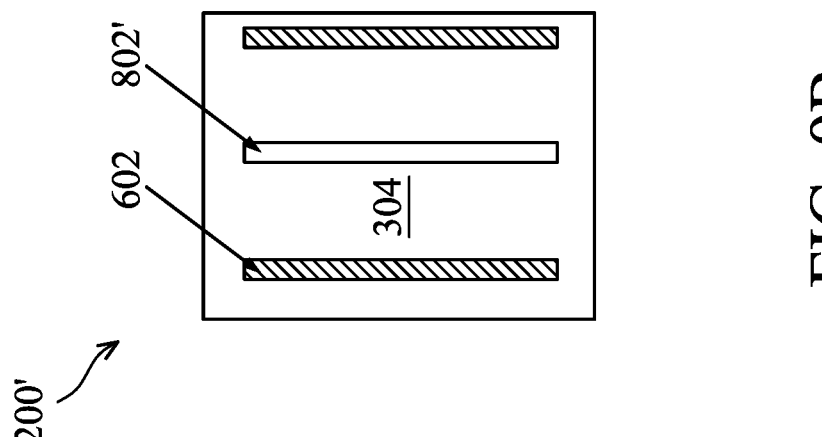
Figure 9A:
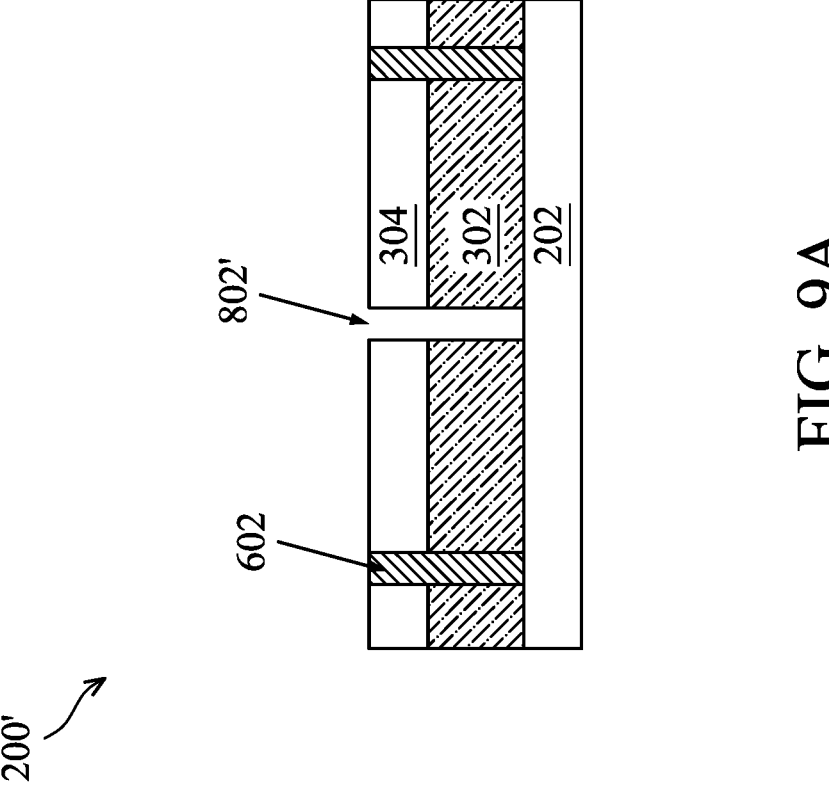
Figure 11B:
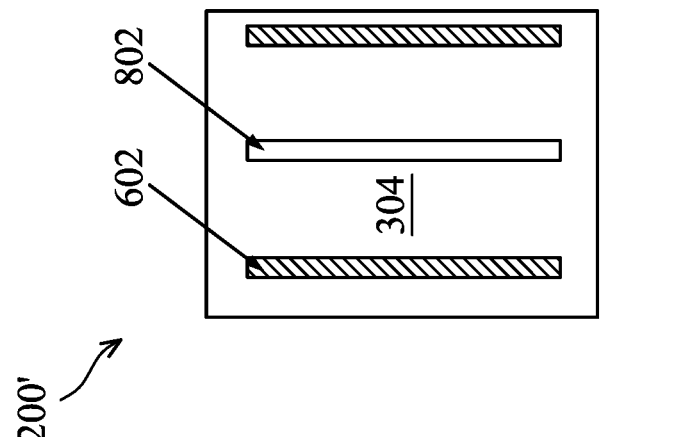
Figure 11A:
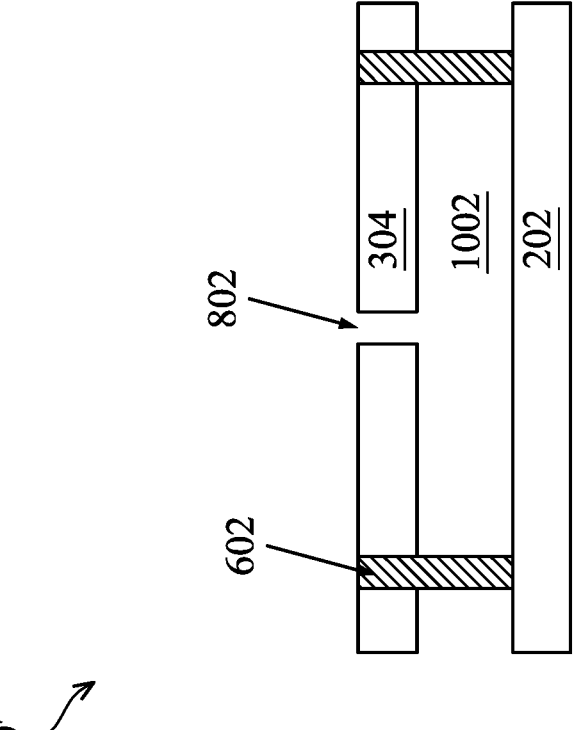
Figure 13B:
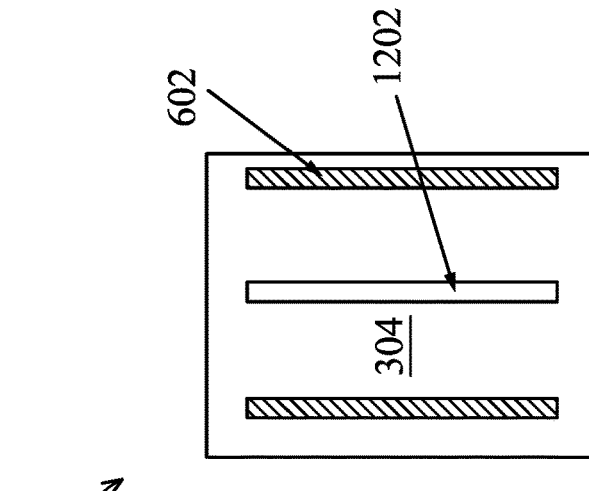
Figure 13A:
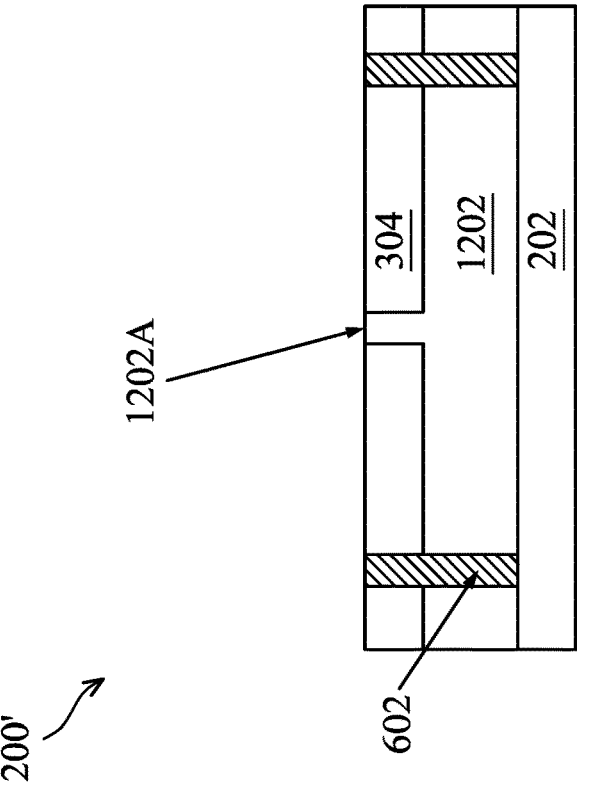
Figure 14B:
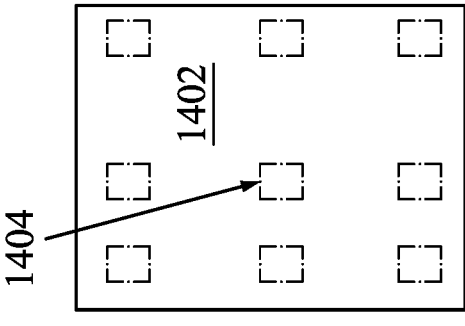
Figure 14A:
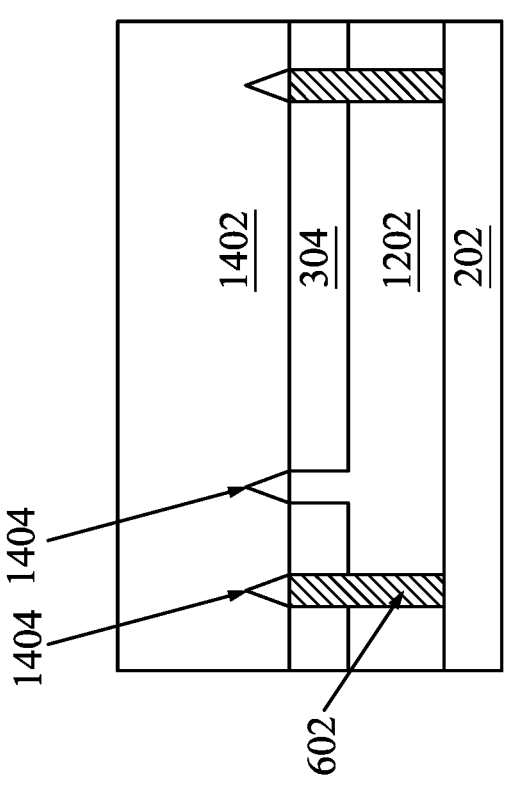
Figure 15B:
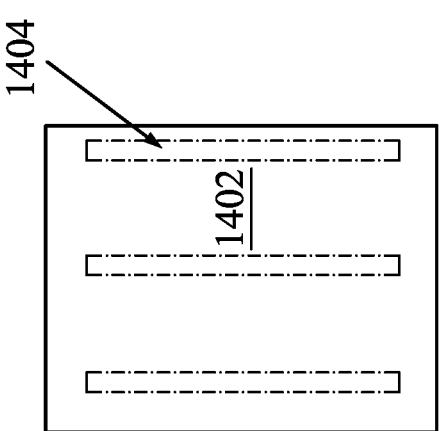
Figure 15A:
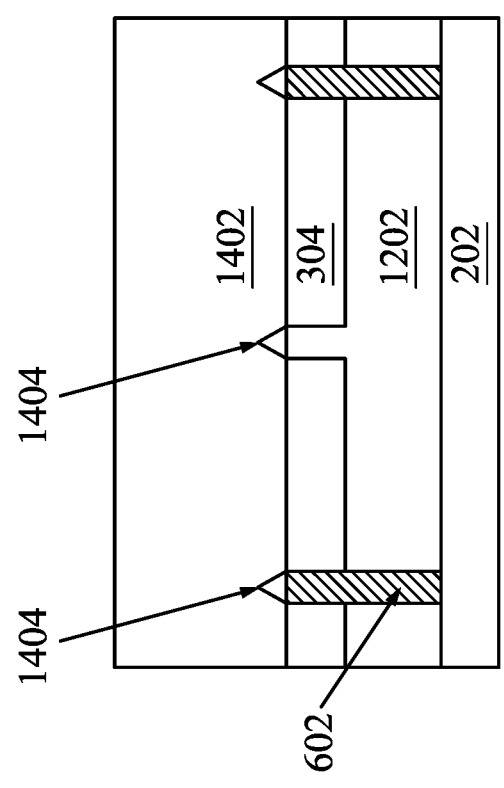

The openings 802, as illustrated in FIG. 8B, have a circular-shape in a top view, or a cross-section taken across the x-direction and y-direction. However, the shape of openings 802 illustrated in FIG. 8B are exemplary only and other shapes may also be possible. For example, the openings 802 may be circular, rectangular, linear bars, and/or other suitable shapes. As an example, the openings 802′ of FIGS. 9A and 9B illustrate a linear bar opening. While the linear bar openings 802′ of FIGS. 9A and 9B are illustrated as stopping at the base substrate 202, in other implementations, slight etching of the base substrate 202 or the opening may stop with the sacrificial layer 302. In some implementations, the shape of openings 402 differ from the shape of openings 802 for a given embodiment. For example, a device may include a circular shaped opening 402 and a linear bar shaped opening 802′; another device may include a linear bar shaped opening 402′ and a circular shaped opening 802.

In some implementations, the configuration of the openings 802 (802′) including their depth, shape, size and/or pattern is selected to provide adequate openings for introduction of the etchant targeting the removal of the sacrificial layer 302, as discussed below. In some implementations, the configuration (or pattern) of the openings 802 (802′) is selected to provide a lateral offset between the openings 802 and the regions of the substrate upon which the active areas of semiconductor devices will subsequently be formed. In other words, the openings 802 are not directly underneath (in the z-direction) the region of the wafer upon which the active regions such as channel regions will be formed. Instead, the openings 802 are offset laterally in the x-direction and/or y-direction from an active region disposed above (in z-direction) the sacrificial layer 302. This discussion is equally applicable to openings of other shapes such as openings 802′. As discussed below, the lateral offset is important in some implementations to minimize defects formed over the dielectric material disposed in the openings 802 of the semiconductor layer 304 from impacting the defect-sensitive active region of the semiconductor device.

In an embodiment, at least one opening 802 interposes adjacent dielectric support features 602. This configuration allows for sufficient etchant to remove the regions of the sacrificial layer 302 interposing the dielectric support features 602.

The method 100 then proceeds to block 116 where a sacrificial layer of the stack is removed to form a gap. The removal may include providing etchants to the sacrificial layer by way of the openings provided in block 114. The sacrificial layer is removed by an etching process selective to the material of the sacrificial layer with little to no etching of the base substrate, semiconductor layer, and/or dielectric supporting features. In some embodiments, the sacrificial layer is removed from the entirety of the base substrate 202.

The selective etching process to remove the sacrificial layer may be a dry etching process, a wet etching process, other suitable etching process, or combinations thereof. The dry etching process may implement a hydrogen-comprising etch gas (e.g., $H_2$ and/or $CH_4$), a nitrogen-comprising etch gas (for example, $N_2$ and/or $NH_3$), a chlorine-comprising etch gas (for example, $Cl_2$, $CHCl_3$, $CCl_4$, and/or $BCl_3$), a fluorine-comprising etch gas (for example, $F_2$, $CH_3F$, $CH_2F_2$, $CHF_3$, $CF_4$, $C_2F_6$, $SF_6$, and/or $NF_3$), a bromine-comprising etch gas (e.g., $Br$, $HBr$, $CH_3Br$, $CH_2Br_2$, and/or $CHBr_3$), other suitable etch gas, or combinations thereof. In an embodiment, the etchant gas includes one or more of HBr/CH4/CH3F/Cl etchant gases.

In some embodiments, a dry etching process (such as an RIE process) utilizes a fluorine-containing gas (for example, $SF_6$) to selectively etch the sacrificial layer 302. In some embodiments, a ratio of etchants, an etching temperature, and/or an RF power may be tuned to selectively etch a composition of the sacrificial layer 302 (e.g., silicon germanium). In some embodiments, a wet etching process utilizes an etching solution that includes ammonium hydroxide ($NH_4OH$) and water ($H_2O$) to selectively etch a composition of the sacrificial layer (e.g., silicon germanium). In an embodiment, the sacrificial layer is selectively etched using an etchant including $HF:HNO_3:H_2O$. In some embodiments, a chemical vapor phase etching process using hydrochloric acid (HCl) selectively etches composition of the sacrificial layer (e.g., silicon germanium).

Various parameters of the etch process can be tuned to achieve selective etching of the sacrificial layer 302, such as a flow rate of an etch gas, a concentration of the etch gas, a concentration of the carrier gas, a ratio of the concentration of a first etch gas to the concentration of a second etch gas, a ratio of the concentration of the carrier gas to the concentration of the etch gas, a concentration of a wet etch solution, a ratio of the concentration of a first wet etch constituent to the concentration of a second wet etch constituent in the wet etch solution, a power of an RF source, a bias voltage, a pressure, a duration of the etch process, a temperature maintained in a process chamber during the etch process, a temperature of a wafer during the etch process, a temperature of the wet etch solution, other suitable etch parameters, or combinations thereof.

Referring to the example of FIGS. 10A, 10B, 10C, 11A, and 11B, gap 1002 is formed by the removal of the sacrificial layer 302. It is noted that during the etching of the sacrificial layer 302, the dielectric support features 602 act as support for the semiconductor layer 304 to avoid collapse, bowing, or warpage during their suspension over the formed gap. Portion of the opening 802 through the semiconductor layer 304 is maintained and is contiguous with the gap 1002. The etchant provided to remove the sacrificial layer 302 may selectively etch the material of the sacrificial layer 302, while avoiding etching the material of the semiconductor layer 304, the base substrate 202, and the material of the dielectric support features 602.

The method 100 then proceeds to block 118 where an insulating material is deposited in the gap formed in block 116. In an embodiment, the insulating material is an oxide such as a silicon oxide. In some examples, the oxide layer may include CVD-deposited oxide, and/or ALD-deposited oxide, and/or oxide or other dielectric formed by suitable techniques. In an embodiment, the oxide layer is thermally-grown. In some embodiments, the oxide layer is a multi-layer structure.

Referring to the example of FIGS. 12A, 12B, 12C, 13A, and 13B, an insulating layer 1202 is formed in the gap 1002. The insulating layer 1202 also extends to fill the portion of the opening 802 (802', 802'') within the semiconductor layer 302, thereby providing insulating layer portion 1202A within the semiconductor layer 304. In an embodiment, the insulating layer 1202 is an oxide such as silicon oxide. The insulating layer 1202 may directly interface the base substrate 202, the semiconductor layer 304, and the dielectric support features 602. In some implementations, the insulating layer 1202 completely fills the space interposing the base substrate 202 and the semiconductor layer 304 across the wafer, except where the dielectric support features 602 are formed. In some implementations, the material of the insulating layer 1202 (e.g., oxide) may be deposited such that it overfills the opening 802 (802' or 802'') and is initially disposed on a top surface of the semiconductor layer 304. The oxide may then be subsequently etched back during a planarization (e.g., CMP) process.

Thus, provided by embodiments of the above blocks of the method 100 is a semiconductor structure 200 (200', 200'') that includes the base substrate 202, an insulating layer 1202, and a semiconductor layer 304. The semiconductor structure 200 (200', 200'') further includes a dielectric support feature 602 extending through the insulating layer 1202. The semiconductor layer 304 includes openings in which the dielectric support feature 602 and a portion of the insulating material 1202A are disposed. The semiconductor structure 200 (200', 200'') provides an SOI substrate. The semiconductor structure 200 may be used as a starting SOI substrate for formation of various semiconductor devices.

In some embodiments, the method 100 then proceeds to block 120 where an epitaxial material is grown on the semiconductor structure 200, or the SOI substrate provided by the blocks 102 to 118. The epitaxial material may be grown directly on the semiconductor layer of the structure. In some embodiments, the epitaxial material grown may form portions of active regions on which devices are to be subsequently formed. In other embodiments, the epitaxial material may form a first layer of a multi-layer stack on which or from which semiconductor devices are subsequently formed. The epitaxial layer may be formed by a molecular beam epitaxy (MBE) process, liquid phase epitaxy, vapor-phase epitaxy, a metalorganic chemical vapor deposition (MOCVD) process, a chemical vapor deposition (CVD) process, ultra-high vacuum CVD (UHV-CVD), LPCVD, and/or PECVD), and/or other suitable formation processes.

Referring to the example of FIGS. 14A, 14B, 14C, 14D, 15A, and 15B, an epitaxial layer 1402 is formed over the semiconductor layer 304. In some implementations, the epitaxial layer 1402 is grown from a seed of the top surface of the semiconductor layer 304. In an embodiment, the semiconductor layer 304 is (100) Si, such that a (100) Si plane provides the seed region. In an embodiment, the semiconductor layer 304 is (111) Si, such that a (111) Si plane provides the seed region. Because the epitaxial growth rate may be decreased (or negligible) on the exposed dielectric support feature 602 and/or the insulating material portion 1202A, voids 1404 may be formed overlying one or more of the non-crystalline materials (e.g., dielectric support feature 602 and/or the insulating material 1202).

In an embodiment, the epitaxial material 1402 is silicon and the semiconductor layer 304 is silicon for example, providing for homoepitaxial growth of the epitaxial material 1402. In a further embodiment, a crystalline plane of the epitaxial material 1402 exposed by the void 1404 is a Si(111) plane. Thus, the void 1404 is defined by a top surface of dielectric support feature 602 or the insulating material 1202 and a plurality of Si(111) plane surfaces of the epitaxial layer 1402.

In an embodiment, because of the difference in growth rate between the epitaxial material 1402 on the semiconductor layer 304 and the non-crystalline materials (e.g., dielectric support feature 602 and/or the insulating material 1202), the void 1404 provides a defect over the non-crystalline materials due to the merging of epitaxy material from opposing sides of non-crystalline materials (dielectric support feature 602 and/or the insulating material 1202). These defects may propagate as shown by the dotted lines in FIG. 14D. In some embodiments, the defects may terminate.

It is noted that in some implementations, the epitaxial material 1402 and the semiconductor layer 304 are both silicon. Growing silicon upon a silicon seed area (e.g., semiconductor layer 304) allows for an improved quality of epitaxial material 1402 due to the low lattice mismatch between the seed and the grown epitaxial material 1402. The improved quality epitaxial material 1402 may be desirable to form a substantially defect-free active region (e.g., including channel layer) of a semiconductor device.

In some embodiments, the epitaxial growth of the epitaxial material 1402 is performed at a high-temperature to drive bottom-up growth of the epitaxial material resulting in a high-quality material. Example epitaxial growth temperatures include 900-1700 Celsius. The high temperature provides for increased incorporation kinetics and distribution of reactive molecules at the surface of the seed area. If the temperature is too low, lateral growth may increase reducing the quality of the grown material.

Figure 16B:
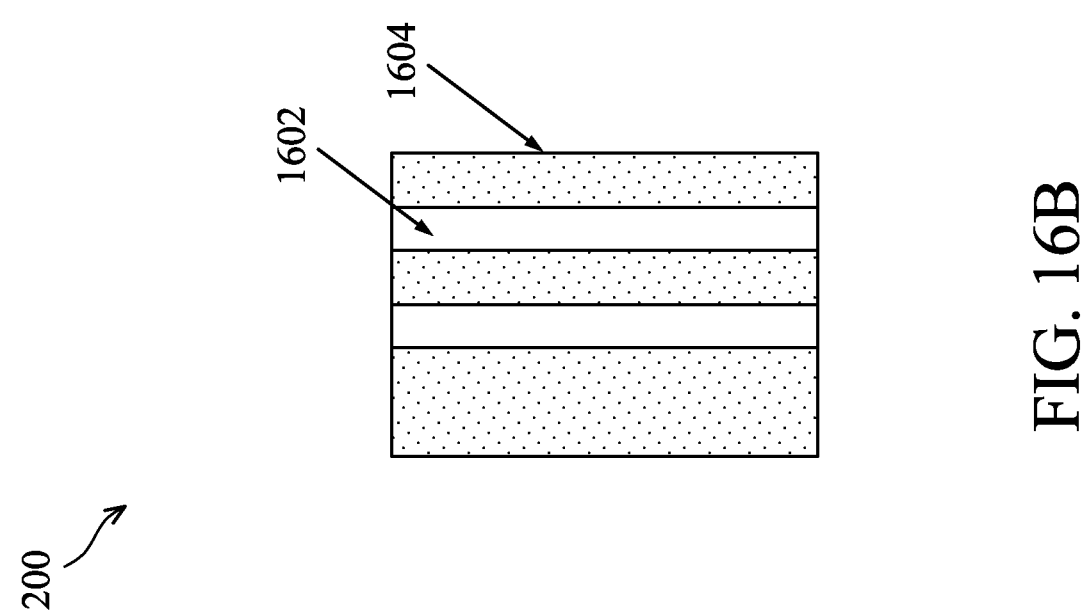
Figure 16A:
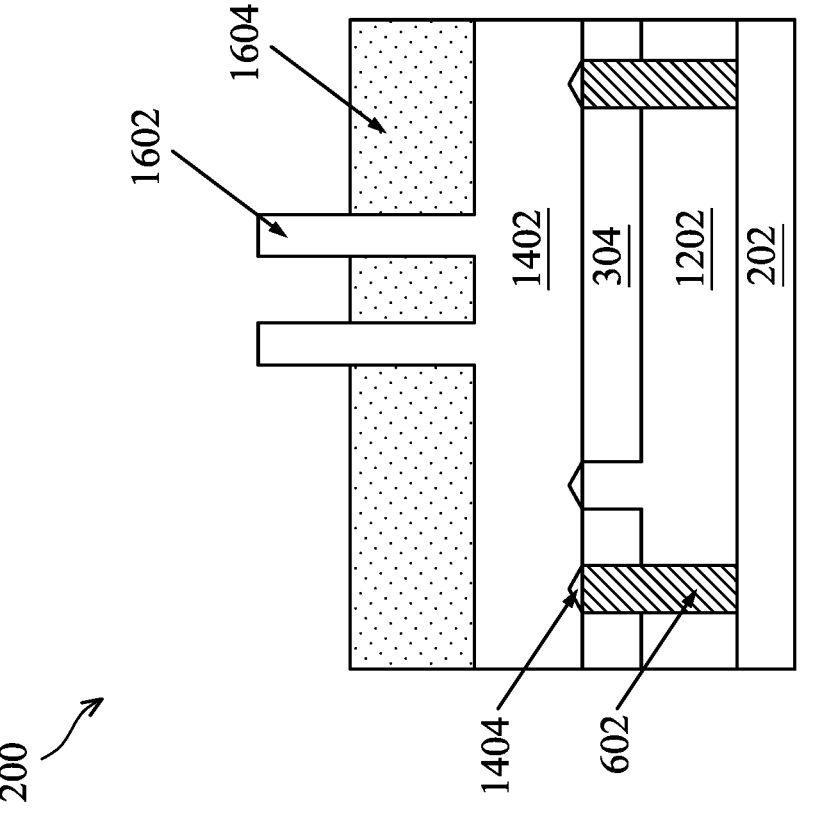
Figure 16D:
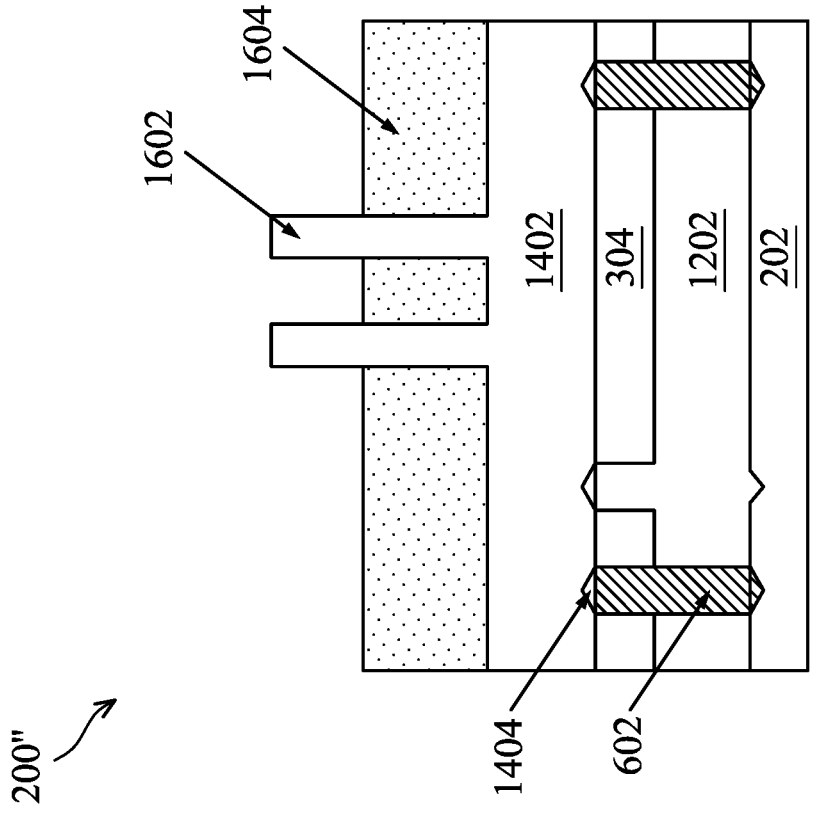
Figure 16C:
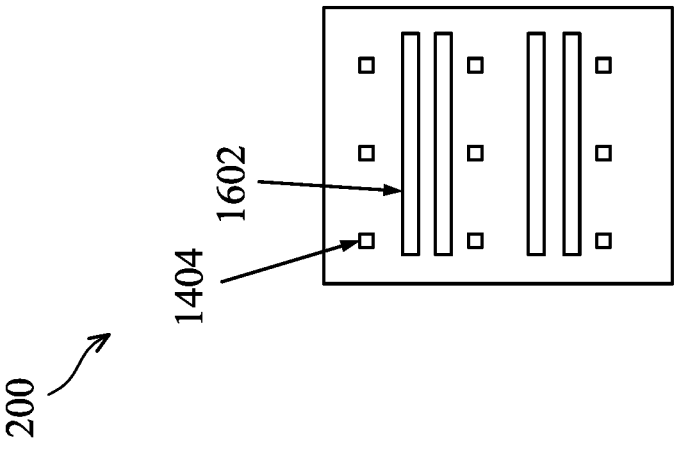

In some embodiments, the method 100 then proceeds to block 122 where an active region of a semiconductor device is defined. In some embodiments of the method 100, an active region of a FET is formed, such as a FinFET or GAA device. In an embodiment, the active region includes a channel region of a FET, such as a FinFET or GAA device. In some embodiments, the active region including the channel region is formed of the grown epitaxial material of block 120. Referring to the example of FIGS. 16A, 16B, 16C and 16D, the epitaxial material 1402 is patterned to form active regions in the form of fin structures 1602. Isolation features 1604 are formed adjacent to and interposing the fin structures 1602. In an embodiment, the dielectric support features 602 and/or the insulating portion 1202A within the semiconductor layer 304 are formed vertically (in the z-direction) under the isolation features 1604. In other words, the dielectric support features 602 and/or the insulating portion 1202A within the semiconductor layer 304 are not vertically aligned under the fin structures 1602, but laterally offset (in the x-direction and/or y-direction) from being vertically aligned with the fin structures 1602. This is illustrated by FIG. 16C which shows the lateral offset (e.g., in the x-direction where the fin structures are extending in a y-direction) of the voids 1404 (formed over the dielectric support structures 602 and the insulating material 1202A) from the active regions of the fin structures 1602.

In some implementations, a fin etching process is performed on the epitaxial layer 1402 to form the active regions of the fin structures 1602. In some embodiments, a masking element is formed over the epitaxial layer 1402 defining the fin structure regions. Using the masking element to protect regions of the epitaxial layer 1402, in an embodiment, an anisotropic dry etching process (for example, a RIE process) is configured to substantially remove portions of the epitaxial layer 1402. In some embodiments, the etching process may continue to remove portions of the semiconductor layer 304. In some implementations, a dry etching process uses a fluorine-containing precursor (for example, CF4, SF6, NF3, CH2F2, CHF3, and/or C2F6), an oxygen-containing precursor, a chlorine-containing precursor (for example, Cl2, CHCl3, CCl4, and/or BCl3), a bromine containing precursor (for example, HBr and/or CHBR3), an iodine-containing precursor, other suitable precursor (which can be used to generate an etchant gas and/or etching plasma), or combinations thereof. In some implementations, a wet etching process implements an etching solution that includes TMAH, NH4OH, H2O2, H2SO4, HF, HCl, other suitable wet etching constituent, or combinations thereof.

In some embodiments, isolation features 1604 are then formed interposing the fin structures 1602. In some implementations, the isolation features 1604 include silicon oxide, silicon nitride, silicon oxynitride, other suitable isolation material (for example, including silicon, oxygen, nitrogen, carbon, or other suitable isolation constituent), or combinations thereof. The isolation features 1604 may be a multi-layer structure. In some implementations, isolation features 1604 can be configured to form shallow trench isolation (STI) structures, deep trench isolation (DTI) structures, and/or local oxidation of silicon (LOCOS) structures to define active regions of IC device within the epitaxial layer 1402 (i.e., fin structures 1602). In some embodiments, STI features are formed by depositing an insulator material over substrate after etching the fin structures 1602 such that the insulator material fills the etched trenches between fins and performing a chemical mechanical polishing (CMP) process to remove excessive insulator material. The CMP process may be performed until exposing top surfaces of fins 1602. An etching back of the insulator material layer can then be performed to form the isolation features 1604. Other methods of forming the fin structures 1602 and isolation features 1604 are also possible and within the scope of the present disclosure.

Figure 17:
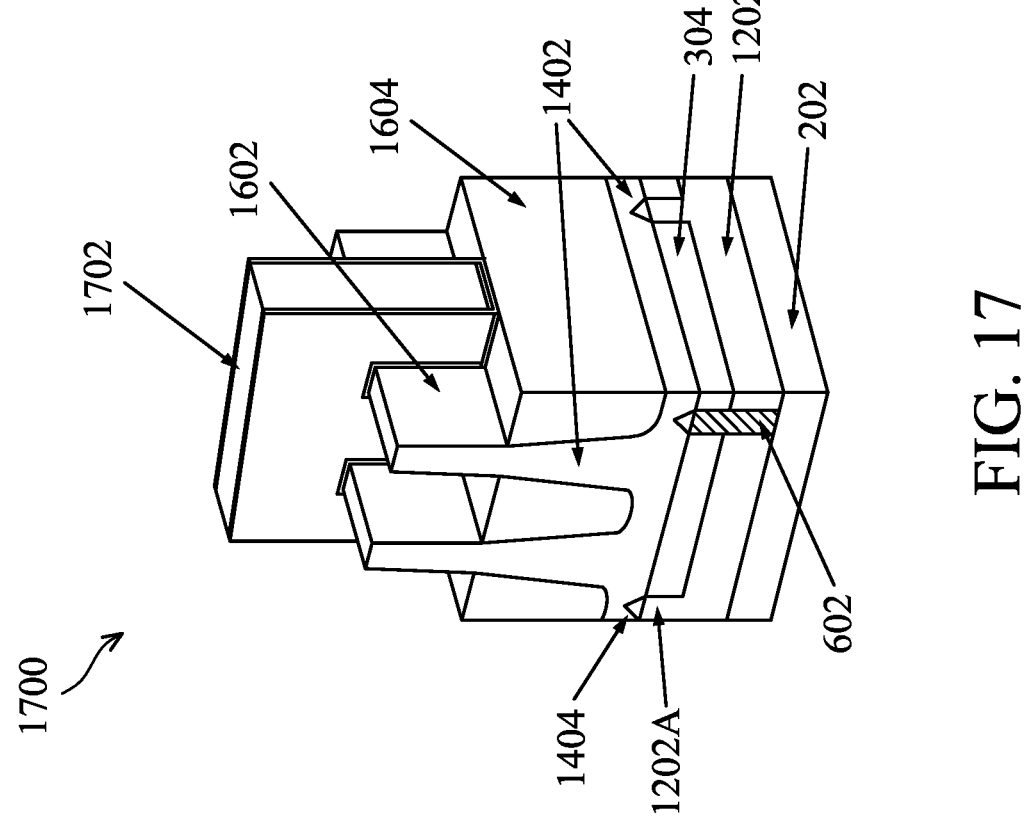
FIG. 17 is an embodiment of an isometric view of an embodiment of a FinFET device including an embodiment of a semiconductor structure formed according to aspects of the method of FIG. 1.

In some embodiments, the method 100 may then proceed to additional fabrication steps represented by block 124 including forming one or more features of the semiconductor device(s) over the semiconductor structure. In some embodiments, a gate structure is formed over the fin structures 1602 interposing source/drain features and creating a channel region within the fin structures 1602. FIG. 17 is illustrative of an example FinFET device 1700 that may be fabricated according to steps of the method 100 and/or include features of the semiconductor structure formed according to one or more steps of the method 100. As illustrated, in an embodiment, a gate structure 1702 is illustrated over the fin structures 1602. Various dielectric support features 602 and/or the insulating material 1202A within the semiconductor layer 304 are illustrated in FIG. 17. Again, the location of the dielectric support feature 602 and/or the insulating material 1202A are exemplary only and not intended to be limiting. In embodiments however, the active regions (e.g., fin structures 1602) may not be vertically aligned over the dielectric support feature 602 and/or the insulating material 1202A but laterally offset from the active regions.

The gate structure 1702 may be formed using a gate first, gate last, or hybrid process. The gate structure 1702 includes a gate dielectric layer and a gate electrode formed over the gate dielectric layer. Gate dielectrics include a dielectric material, such as silicon oxide, high-k dielectric material, other suitable dielectric material, or combinations thereof. Exemplary high-k dielectric materials include hafnium, aluminum, zirconium, lanthanum, tantalum, titanium, yttrium, oxygen, nitrogen, other suitable constituent, or combinations thereof. In some implementations, the one or more high-k dielectric layers include HfO2, HfSiO, HfSiON, HfTaO, HfTiO, HfZrO, ZrO2, Al2O3, HfO2-Al2O3, TiO2, Ta2O5, La2O3, Y2O3, other suitable high-k dielectric material, or combinations thereof. In some implementations, gate dielectrics further include an interfacial layer (including a dielectric material, such as silicon oxide) disposed between the high-k dielectric layer and fin structures 1602. Gate electrodes include an electrically conductive material. In some implementations, gate electrodes include multiple layers, such as one or more capping layers, work function layers, glue/barrier layers, and/or metal fill (or bulk) layers. The gate electrodes may be configured to achieve a p-type work function or achieve an n-type work function. A work function layer can include a conductive material tuned to have a desired work function (such as an n-type work function or a p-type work function), such as p-type work includes TiN, TaN, Ru, Mo, Al, WN, ZrSi2, MoSi2, TaSi2, NiSi2, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. Source and drain features are formed on opposing sides of the gate structure 1702 with a channel region defined in the fin structure 1602 under the gate structure 1702. An epitaxy process can implement CVD deposition techniques (for example, vapor phase epitaxy (VPE), ultra-high vacuum CVD (UHV-CVD), LPCVD, and/or PECVD), molecular beam epitaxy, other suitable SEG processes, or combinations thereof to form the source/drain features. The features may be grown on the fin structure 1602 such as a recessed portion of said fin structure 1602. Source/drain features are doped with n-type dopants and/or p-type dopants. In some embodiments, like the channel regions, the source/drain regions may not be vertically aligned over the dielectric support feature 602 and/or the insulating material 1202A.

Figure 18:
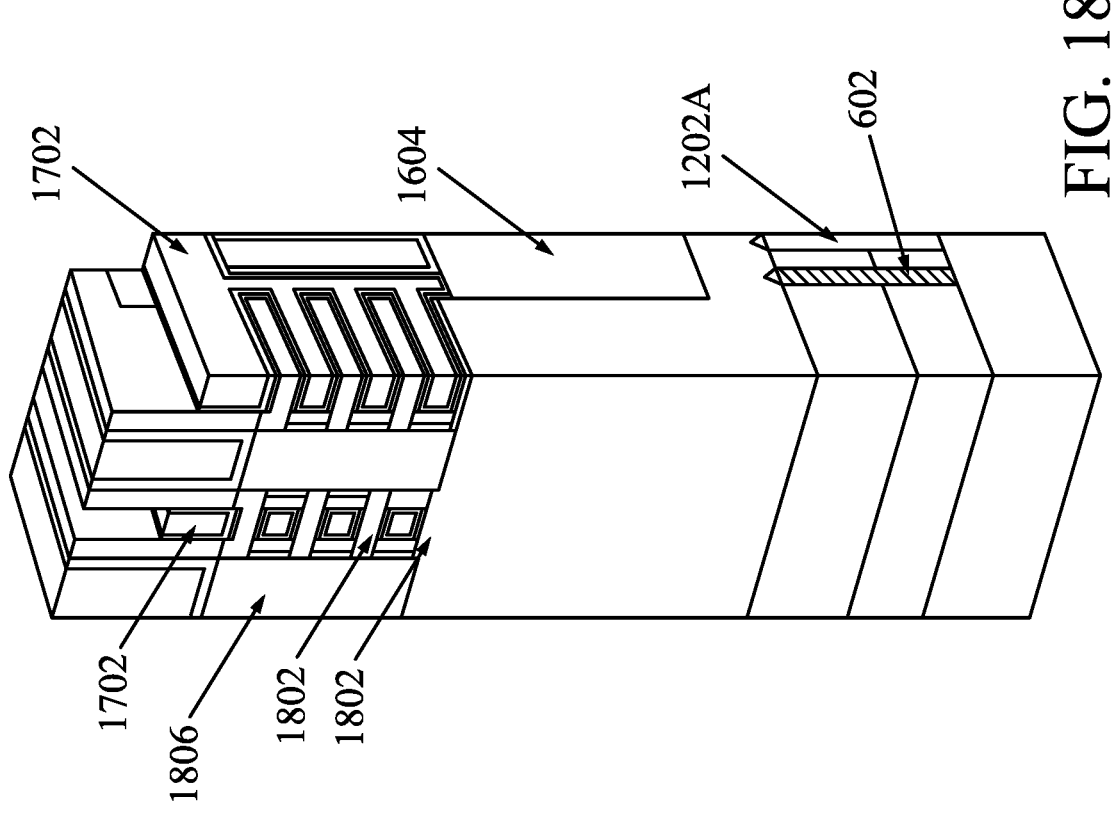
FIG. 18 is an embodiment of an isometric view of an embodiment of a gate-all-around (GAA) including an embodiment of a semiconductor structure formed according to aspects of the method of FIG. 1.

Referring now to FIG. 18, illustrated is another embodiment of a semiconductor device that may be formed on the semiconductor structure fabricated according to one or more steps of the method 100. The exemplary gate all around (GAA) device 1800 provides a plurality of channel regions 1802 formed of and over epitaxial material 1402. In the GAA configuration, the gate structure 1702 (including a high-k gate dielectric, interfacial layer, and gate electrode substantially similar to as discussed above) wraps around at least one of the channel regions 1802. Certain of the channel regions 1802 may be formed of the epitaxial layer 1402 or may be formed semiconductor layers formed thereover. The channel regions 1802 may be referred to as nanowires, nanosheets, nanobars, and/or other suitable nanostructures. The isolation features 1604, which may be substantially similar to as discussed above, interpose portions of the epitaxial layer 1402 over which the active regions are formed. Dielectric structures 1804, also referred to as dielectric fins, overlie the isolation features 1604 and isolate adjacent features of the devices (e.g., gate structures 1702). Source/drain features 1806 are disposed on opposing sides of the channel regions 1802.

As above, the semiconductor structure 200 (or 200', 200") is used to form the device 1800. The dielectric support structures 602 and the insulating material portion 1202A are configured such that they are not vertically aligned under the active regions including the channel regions 1802. In some embodiments, the dielectric support structures 602 and the insulating material 1202A underlie and are vertically aligned under the isolation features 1604.

In further embodiments, the semiconductor structure 200 may provide portions (e.g., substrate) for various other devices and features, such as other types of implanted regions, devices such as additional transistors, bipolar junction transistors, resistors, capacitors, inductors, diodes, fuses, static random-access memory (SRAM) and/or other logic circuits, etc. In some embodiments, the semiconductor structure 200 formed in the method 100 includes formed thereover a plurality of semiconductor devices (e.g., transistors), including PFETs, NFETs, such as the FinFET 1700, GAA device 1800, which may be interconnected.

Thus, provided are methods and devices that form a semiconductor structure that provides a silicon-on-insulator (SOI) substrate for use in forming semiconductor devices. The semiconductor structure 200 provides for a method to form a SOI substrate without the need for wafer bonding processes, thus simplifying the process flow. Features of the methods and structures also, in some embodiments, provide for a high-quality oxide to be deposited on a base substrate forming the insulator layer of the SOI structure. Features of the methods and structures also, in some embodiments, provide for a high-quality semiconductor to be grown on a sacrificial crystalline layer for example avoiding growth over large areas of insulator material.

In one of the broader embodiments discussed herein, a semiconductor structure is provided including a base substrate, an oxide layer over the base substrate, and a semiconductor layer over the oxide layer. An insulating pillar extending through the semiconductor layer and the oxide layer. The insulating pillar includes a composition different than the oxide layer.

In a further embodiment of the semiconductor structure, the insulating material is silicon nitride. In an embodiment, the semiconductor layer is silicon. In an embodiment, the semiconductor structure further includes an epitaxial layer over the semiconductor layer. In some implementations, a channel region of a semiconductor device is disposed in the epitaxial layer. The channel region of the semiconductor device may be in a fin structure formed of the epitaxial layer. In some embodiments, the epitaxial layer is disposed directly on the semiconductor layer and a void interposes the epitaxial layer and the insulating pillar. In an embodiment, the insulating pillar of the structure extends from a first opening in the semiconductor layer through the oxide layer and into the base substrate. In an embodiment, the insulating pillar interfaces a top surface of the base substrate.

In another of the broader embodiments, a semiconductor device is provided that includes a silicon-on-insulator (SOI) structure and a field effect transistor (FET) formed over the SOI substrate. The SOI structure includes a base substrate, an oxide layer over the base substrate, and a dielectric feature extending from a top surface of the base substrate to a top surface of the semiconductor layer. The FET includes a gate structure formed over a channel region the channel region being laterally offset from the dielectric feature.

In a further embodiment, the dielectric feature is a circular shape in a top view. In an embodiment, the dielectric feature is a nitride composition. In an embodiment, a portion of an oxide material of the oxide layer extends through an opening in the semiconductor layer. In an embodiment, the device includes an epitaxial layer over the semiconductor layer and the dielectric feature. A void may interpose the semiconductor layer and the dielectric feature.

In another of the embodiments discussed herein, a method of fabrication of a semiconductor structure is provided. The method includes receiving a base substrate, forming a stack of layers on the base substrate and etching a first opening in the stack of layers. The stack of layers includes a sacrificial layer and a semiconductor layer over the sacrificial layer. The method includes filling the first opening with a dielectric material to form a dielectric support structure. After forming the dielectric support structure, the sacrificial layer is removed to form a gap. The gap is filled with an oxide.

In a further embodiment, the sacrificial layer includes etching a second opening in the stack of layers and removing the sacrificial layer by introducing an etchant through the second opening. In an embodiment, the method includes growing an epitaxial layer over the semiconductor layer after filling the gap with the oxide.

In an embodiment, the epitaxial layer uses a top surface of the semiconductor layer as a seed for the growth. In an embodiment, growing the epitaxial layer includes forming a void between the dielectric support structure and the epitaxial layer. A channel region of a semiconductor device may be formed in the epitaxial layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a base substrate;
   an oxide layer over the base substrate;
   a semiconductor layer over the oxide layer;
   an insulating pillar extending through the semiconductor layer and the oxide layer and into the base substrate, wherein the insulating pillar includes a composition different than the oxide layer and wherein the insulating pillar has a sidewall having the composition and interfacing the oxide layer, the semiconductor layer, and the base substrate;
   an epitaxial layer on the semiconductor layer, wherein fin elements are formed within the epitaxial layer-such that the epitaxial layer extends from interfacing the semiconductor layer to an upper surface of the fin element; wherein a protrusion of the oxide layer extends through the semiconductor layer at a first region spaced a distance from the insulating pillar, and wherein the fin elements are disposed above and laterally spaced from the insulating pillar and the protrusion of oxide in a cross-sectional view such that an isolation region that extending between the fin elements is disposed above and vertically aligned with the insulating pillar and the protrusion of oxide.

2. The semiconductor structure of claim 1, wherein the composition of the insulating pillar comprises silicon nitride.

3. The semiconductor structure of claim 1 wherein the semiconductor layer is silicon.

4. The semiconductor structure of claim 1, wherein the epitaxial layer is disposed directly on the semiconductor layer and wherein a first void interposes the epitaxial layer and the insulating pillar and a second void interposes the epitaxial layer and the protrusion of the oxide layer, wherein the first void and the second void are not directly underneath the fin elements.

5. The semiconductor structure of claim 1, wherein the insulating pillar extending into the base substrate has a cross-sectional view of a triangular shape.

6. The semiconductor structure of claim 1, wherein the insulating pillar has a top view with a circular-shape.

7. The semiconductor structure of claim 1, wherein from a top view a rectangular portion of the semiconductor structure includes a first insulating pillar at a first corner and a second insulating pillar at a second corner, a third insulating pillar at a third corner and a fourth insulating pillar at a fourth corner, wherein the fin elements are disposed between the first, second, third and fourth insulating pillars in the top view.

8. The semiconductor structure of claim 7, wherein the oxide layer has a plurality of raised portions extending through the semiconductor layer, wherein the plurality of raised portions are, in the top view, disposed in a region between the first, second, third, and fourth insulating pillars.

9. A semiconductor device, comprising:
a silicon-on-insulator (SOI) structure, wherein the SOI structure includes:
a base substrate;
an oxide layer over the base substrate;
a semiconductor layer over the oxide layer; and
a dielectric feature extending from a top surface of the base substrate to a top surface of the semiconductor layer, wherein the dielectric feature is one of at least four dielectric features arranged in an array in a top view;
wherein each of the at least four dielectric features is vertically aligned under an isolation feature disposed on the semiconductor layer and wherein active regions of the semiconductor layer extend above the isolation feature, the isolation feature extending between active regions;
an epitaxial layer over the SOI structure, the epitaxial layer interfaces a top surface of the semiconductor layer and extends above the semiconductor layer; and
a field effect transistor (FET) formed over the SOI structure, wherein the FET includes a gate structure formed over a channel region disposed in the epitaxial layer, the channel region being laterally offset from the dielectric feature and the gate structure extending vertically over the dielectric feature.

10. The semiconductor device of claim 9, wherein the dielectric feature is a circular shape in a top view.

11. The semiconductor device of claim 9, wherein the dielectric feature is a nitride composition.

12. The semiconductor device of claim 11, wherein the nitride composition is SiCN.

13. The semiconductor device of claim 9, further comprising: an epitaxial layer over the semiconductor layer and the dielectric feature, wherein a void interposes the epitaxial layer and the dielectric feature.

14. The semiconductor device of claim 9, wherein the isolation feature is a shallow trench isolation feature extends between and adjacent the fin elements that provide the active regions, and wherein the each of the at least four dielectric features is vertically aligned with the shallow trench isolation feature.

15. A semiconductor structure, comprising:
an insulating layer having a first composition on a base substrate;
a semiconductor layer formed on the insulating layer;
a dielectric support structure having a second composition and extending through the insulating layer and the semiconductor layer, the dielectric support structure having an upper surface;
a void disposed on the upper surface of the dielectric support structure, the void surrounded by an epitaxial layer over the semiconductor layer and the upper surface of the dielectric support structure; and
wherein the insulating layer includes a raised portion extending through the semiconductor layer and spaced a distance from the dielectric support structure, wherein vertically aligned with the raised portion is an indentation in the base substrate;
a first active region and a second active region over the semiconductor layer, wherein in a cross-sectional view, the first active region and the second active region are between the raised portion and the dielectric support structure; and
an isolation feature disposed over the semiconductor layer, the dielectric support structure, the void, and the raised portion of the insulating layer.

16. The semiconductor structure of claim 15, further comprising:
an epitaxial layer disposed over the semiconductor layer, the first active region and the second active region each including fin structures extending from the epitaxial layer.

17. The semiconductor structure of claim 15, wherein the void has a triangular shape in the cross-sectional view, and wherein the indentation in the base substrate has a triangular shape.

18. The semiconductor structure of claim 17, wherein a base of the triangular shape is defined by the upper surface of the dielectric support structure.

19. The semiconductor structure of claim 15, wherein the semiconductor layer has a Si (111) plane interfacing the epitaxial layer.

20. The semiconductor structure of claim 15, wherein the raised portion of the insulating layer has a circular shape in a top view and the dielectric support structure has a circular shape in the top view.

* * * * *